(12) United States Patent
Hoang et al.

(10) Patent No.: US 10,658,798 B2
(45) Date of Patent: May 19, 2020

(54) SMART ENERGY METERING SYSTEM AND METHOD

(71) Applicant: PACIFIC GAS AND ELECTRIC COMPANY, San Francisco, CA (US)

(72) Inventors: Quoc Hoang, Walnut Creek, CA (US); Alan Jones, Berkeley, CA (US); Earle Davis, Walnut Creek, CA (US); Young D Nguyen, Alameda, CA (US); Alex Yan, Berkeley, CA (US); Shelley Williams, Antioch, CA (US)

(73) Assignee: PACIFIC GAS AND ELECTRIC COMPANY, San Francisco, CA (US)

( * ) Notice: Subject to any disclaimer, the term of this patent is extended or adjusted under 35 U.S.C. 154(b) by 212 days.

(21) Appl. No.: 15/586,093

(22) Filed: May 3, 2017

(65) Prior Publication Data

US 2018/0109047 A1 Apr. 19, 2018

Related U.S. Application Data

(60) Provisional application No. 62/408,260, filed on Oct. 14, 2016.

(51) Int. Cl.
*G01D 4/00* (2006.01)
*G01D 4/10* (2006.01)
(Continued)

(52) U.S. Cl.
CPC ........... *H01R 13/701* (2013.01); *G01D 4/002* (2013.01); *G01D 4/10* (2013.01); *G01D 11/24* (2013.01);
(Continued)

(58) Field of Classification Search
None
See application file for complete search history.

(56) References Cited

U.S. PATENT DOCUMENTS 6,218,995 B1 * 4/2001 Higgins ................ G01D 4/002
343/719
6,518,528 B2 2/2003 Nickerson et al.
(Continued)

FOREIGN PATENT DOCUMENTS

KR 10-2013-0028460 A 3/2013

OTHER PUBLICATIONS

Korean Intellectual Property Office; PCT International Search Report, Issued in Connection to PCT/US2017/056797; dated Jan. 29, 2018; 3 pages; Korea.
(Continued)

*Primary Examiner* — Paresh Patel
(74) *Attorney, Agent, or Firm* — Greenberg Traurig, LLP

(57) ABSTRACT

Some embodiments include an electric meter assembly including a socket housing with a socket interface extending from a top side of the socket housing, and a removable or portable meter coupled to the socket interface. Further, the electric meter assembly includes at a strap coupled at one end to at least one side of the socket housing. The strap is configured and arranged to extend over at least a portion of the meter from one side of the socket to an opposite side of the socket. Some further embodiments include an electric meter assembly with a support platform including a coupled transformer and socket housing. The socket housing includes a socket interface extending from a top side of the socket housing, and a secondary housing enclosed within the socket housing. The secondary housing includes a CT shunt and a switch assembly including an actuator extending through the top side.

19 Claims, 19 Drawing Sheets

(51) Int. Cl.
    *H01R 13/70*           (2006.01)
    *G01D 11/30*           (2006.01)
    *G01D 11/24*           (2006.01)
    *G01R 22/06*           (2006.01)
    *H01R 13/502*          (2006.01)
    *H01R 13/73*           (2006.01)
    *H01R 24/76*           (2011.01)
    *H01R 107/00*          (2006.01)

(52) U.S. Cl.
    CPC ........... *G01D 11/30* (2013.01); *G01R 22/065* (2013.01); *G01R 22/066* (2013.01); *H01R 13/502* (2013.01); *H01R 13/73* (2013.01); *H01R 24/76* (2013.01); *H01R 2107/00* (2013.01)

(56) References Cited

U.S. PATENT DOCUMENTS

| | | |
|---|---|---|
| 7,265,532 B2 | 9/2007 | Karanam et al. |
| 8,861,227 B2 | 10/2014 | Manion et al. |
| 8,867,233 B2 | 10/2014 | Manion et al. |
| 8,947,246 B2 | 2/2015 | Aiken |
| 2002/0148713 A1 | 10/2002 | Nickerson et al. |
| 2005/0270016 A1 | 12/2005 | Karanam et al. |
| 2012/0026715 A1 | 2/2012 | Manion et al. |
| 2012/0065789 A1* | 3/2012 | Scelzi .................. G01K 17/20 700/291 |
| 2012/0287596 A1 | 11/2012 | Manion et al. |
| 2013/0057408 A1 | 3/2013 | Aiken |

OTHER PUBLICATIONS

Korean Intellectual Property Office; PCT Written Opinion of the International Searching Authority, Issued in Connection to PCT/US2017/056797; dated Jan. 29, 2018; 9 pages; Korea.

European Patent Office; English Translation of Abstract from KR10-2013-0028460; 1 page; Mar. 19, 2013.

* cited by examiner

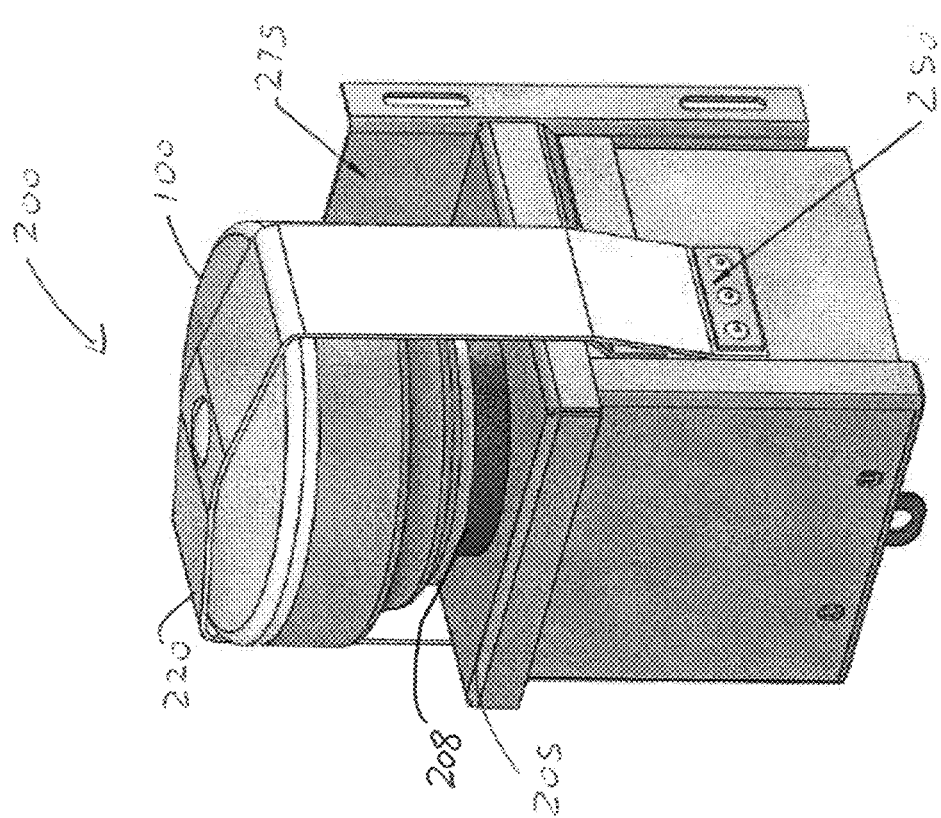

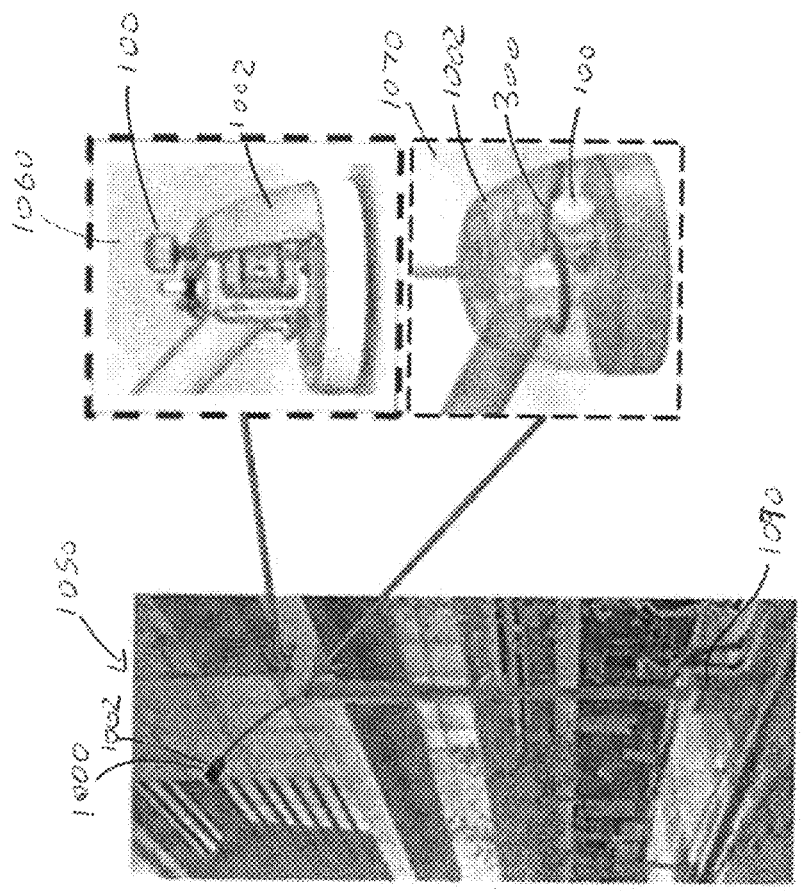
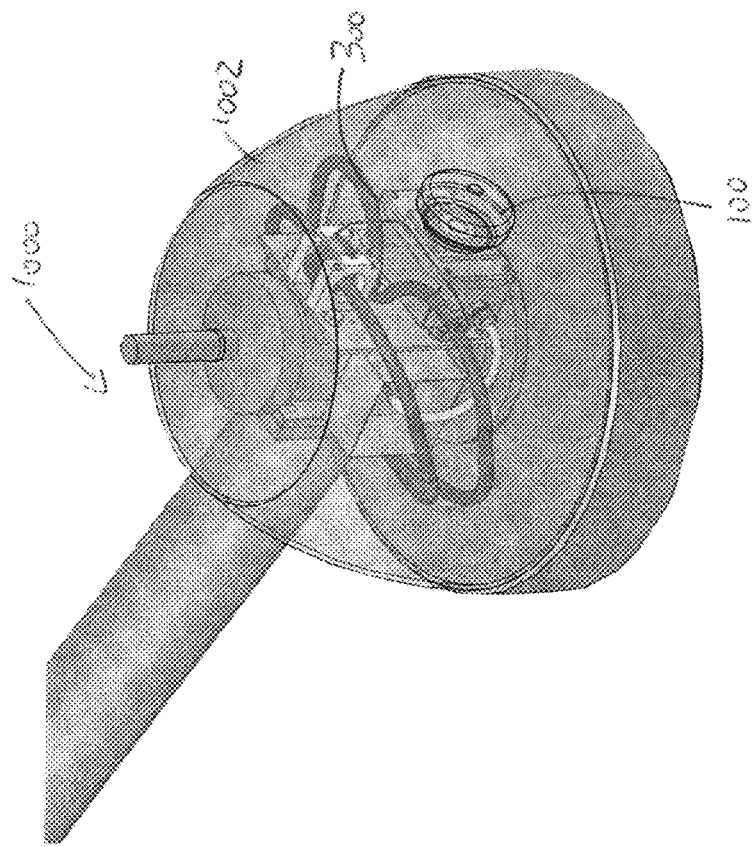
FIG. 10B
FIG. 10A

SMART ENERGY METERING SYSTEM AND METHOD

RELATED APPLICATIONS

This application claims priority to U.S. provisional application Ser. No. 62/408,260, filed on Oct. 14, 2016, the entire contents of which are incorporated herein by reference.

BACKGROUND

Many of today's energy metering systems such as residential and commercial electric and gas meters are bulky and not conveniently mounted or integrated with new or existing infrastructure. Mounting pedestals for self-contained meters are also bulky and costly, and are generally difficult to integrate with adjoining systems.

With the accelerating growth of distributed energy systems and mobile transportation and infrastructure, it would be desirable to provide energy metering systems that can be easily and unobtrusively integrated with existing infrastructure to provide convenient energy delivery, and real time consumption monitoring and transactions.

SUMMARY

Some embodiments of the invention include an electric meter assembly comprising a support platform including at least one transformer coupled to the support platform, where the socket housing is coupled to the support platform. The socket housing comprises a socket interface extending from a top side of the socket housing, and a secondary housing at least partially enclosed within the socket housing, wherein the secondary housing includes at least one CT shunt and at least one switch assembly including an actuator extending through the top side of the socket housing.

Some embodiments further comprise a removable or portable meter coupled to the socket interface. In some embodiments, the actuator includes at least one actuator shaft extending through the top side of the socket housing. In some embodiments, the at least one actuator shaft is configured and arranged to be coupled to at least one shunt via at least one roller contact. In some further embodiments, the at least one actuator shaft is supported within a spring in a plunger housing, and the spring is positioned in a cavity of the plunger housing and extends coupled to a contact of the at least one actuator shaft.

In some embodiments, the shunts include a plurality of electrical contacts. In some further embodiments of the invention, the at least one at least one actuator shaft is configured and arranged to electrically couple and decouple from the plurality of electric contacts based on the movement of the at least one actuator shaft.

Some embodiments include an electric meter assembly comprising a socket housing including a socket interface extending from a top side of the socket housing, and a removable or portable meter coupled to the socket interface. Further, the electric meter assembly comprises at least one strap coupled at one end to at least one side of the socket housing. The at least one strap is configured and arranged to extend over at least a portion of the meter from one side of the socket to an opposite side of the socket.

In some embodiments, the at least one strap is pre-bent. In some embodiments, the socket housing includes at least one strap latch configured to couple to a second end of the at least one strap. Some embodiments include a tamper-resistant seal coupled to a side of the socket housing. In some embodiments, the tamper-resistant seal is configured and arranged to be threaded through an aperture in the at least one strap. In some further embodiments, the at least one strap comprises metal or metal alloy. In other embodiments, the at least one strap comprises polymer.

Some embodiments include at least one bracket coupled to at least one side of the socket housing. Some embodiments include at least one power receptacle extending through one side of the socket housing. In some embodiments, the socket housing is coupled to a support platform including a coupled transformer.

DESCRIPTION OF THE DRAWINGS

FIG. 2C illustrates a perspective view of a smart pole meter and socket assembly in accordance with some embodiments of the invention.

FIG. 10A illustrates a perspective view of a smart pole system including an integrated meter system in accordance with some embodiments of the invention.

FIG. 10B illustrates a pole meter systems with integrated and coupled meter system options in accordance with some embodiments of the invention.

DETAILED DESCRIPTION

Figure 1B:
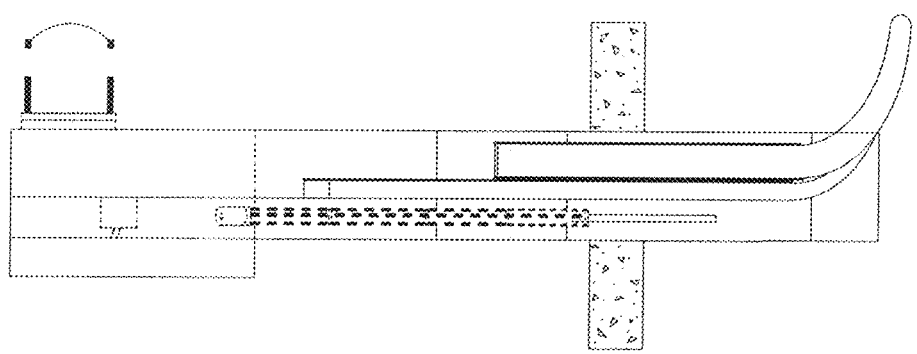
FIG. 1B illustrates a pedestal for the meter shown in FIG. 1A.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Figure 1A:
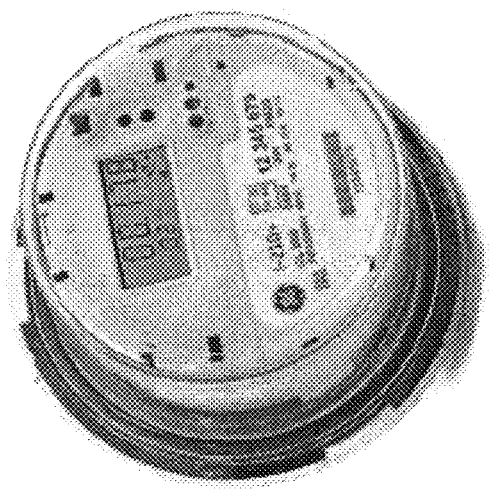
FIG. 1A illustrates a traditional self-contained meter.

FIG. 1A illustrates a traditional self-contained meter. The meter includes a display that can show energy usage, instantaneous power, voltage, and direction of power flow (i.e., received power from a provided or delivered to a provider's grid). Meters of this type include an optical pick-up/pulse output used for programming the meter, and for testing the meter for accuracy. The meter can also include an advanced metering infrastructure ("AMI") network communication card to remotely send energy usage back to the head-end system. The ampere rating is typically 200 A maximum continuous. Other conventional traditional meters include transformer-rated meters coupled to a transformer for power that can provide the ability to provide an ampere rating of unlimited with step down current transformers. Meters of this type can include a display that can show energy usage, instantaneous power, voltage, and direction of power flow (i.e., received power from a provided or delivered to a provider's grid). Meters of this type can also include an optical pick-up/pulse output used for programming the meter, and for testing the meter for accuracy. Meters of this type can also include an AMI network communication card to remotely send energy usage data back to the head-end system.

The attachment of traditional self-contained meters to power infrastructure is usually accomplished using a pedestal mount. For example, FIG. 1B illustrates a pedestal for the meter shown in FIG. 1A. The pedestal is bulky, requires added space, and the panel and construction cost is not insignificant.

Some embodiments of the invention described herein include improvements over the traditional self-contained meters and mounting solutions described above. For example, some embodiments include an electric meter end point hardware assembly including an electric meter socket and removable or portable meter. Some embodiments include a panel socket that in some instances can be a customer-owned device. The socket provides a coupling point for at least one electric meter end point hardware assembly. For example, some embodiments include a meter socket that can function as a hub, receptacle, and/or contact point for one or more further components of an electric metering system. In some embodiments, the meter socket can contain voltage and/or current sensors. Further, the meter socket can provide DC and/or induction power supply and female connection for other metrology and communication devices such as electric, gas, water, data, etc. In some embodiments, the meter socket can include at least one standard connection known in the art, at least one of which can be replaceable. The meter socket can include sensing of AC and/or DC values of phase voltage, phase current, and phase angle.

Figure 2B:
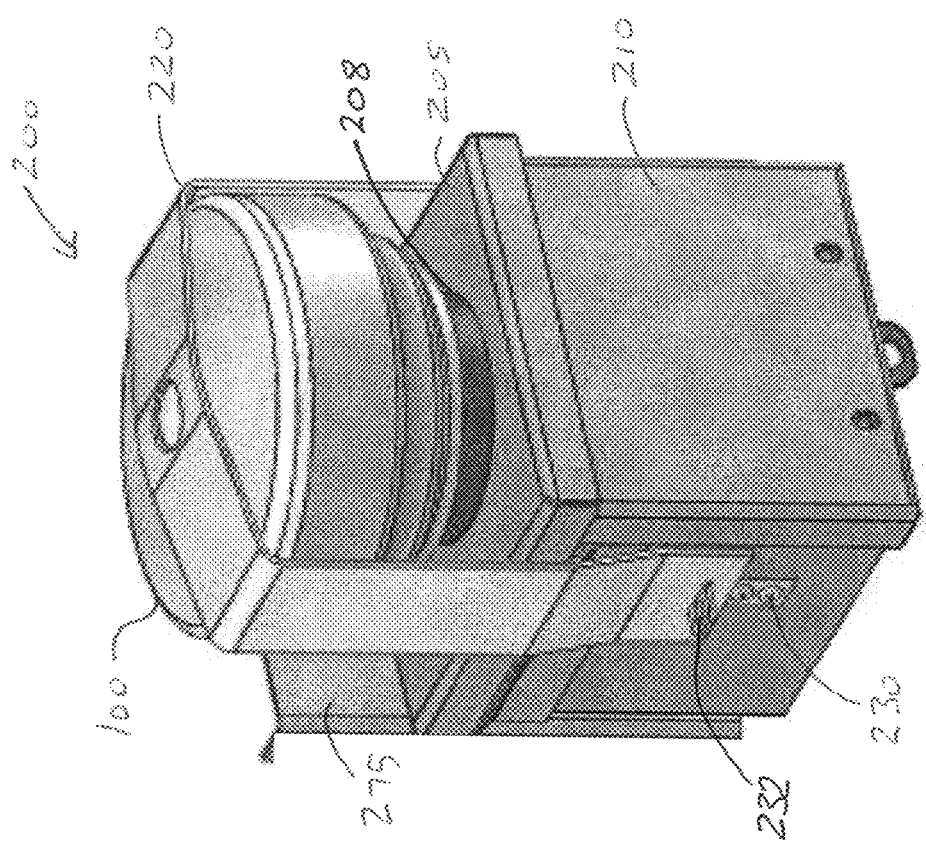
FIG. 2B illustrates a perspective view of a smart pole meter and socket assembly in accordance with some embodiments of the invention.
Figure 2A:
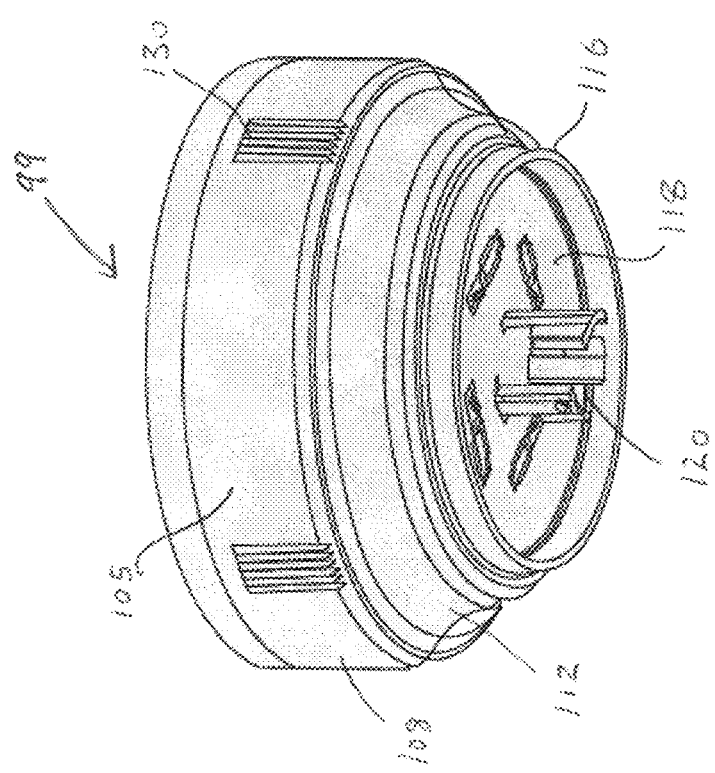
FIG. 2A illustrates a bottom perspective view of a smart self-contained pole meter in accordance with some embodiments of the invention.

FIG. 2A, illustrates a smart self-contained pole meter 99 in accordance with some embodiments of the invention. In some embodiments, the pole meter 99 can comprise a meter housing 105 including an upper section 108 and a lower section 112. In some embodiments, the lower section 112 can include a receptacle side 118. In some embodiments, a rim 116 can extend from the lower section 112, circumferentially enclosing the receptacle side 118. Some embodiments include one or more plug contacts 120 extending from the receptacle side 118. Further, in some embodiments, the meter housing 105 can include one or more grills, vents, or apertures. For example, some embodiments include one or more grills, vents, or apertures 130 positioned on the upper section. In some embodiments, the meter housing 105 can include grills, vents, or apertures 130 evenly spaced around the circumference of the meter 99. Some embodiments include one or more grills, vents, or apertures 130 positioned on an opposite side than shown in FIG. 2A. In other embodiments, the one or more grills, vents, or apertures 130 can extend a partial wide of the upper section 108. In other embodiments, the one or more grills, vents, or apertures 130 can extend fully across the width of the upper section 108. In some further embodiments, the one or more grills, vents, or apertures 130 can extend a partial wide of the lower section. The non-limiting embodiment shown in FIG. 2A illustrates a meter housing 105 that is generally round or circular-shaped, however other embodiments can include ellipsoidal-shaped housings, or square or rectangular housings.

Figure 2E:
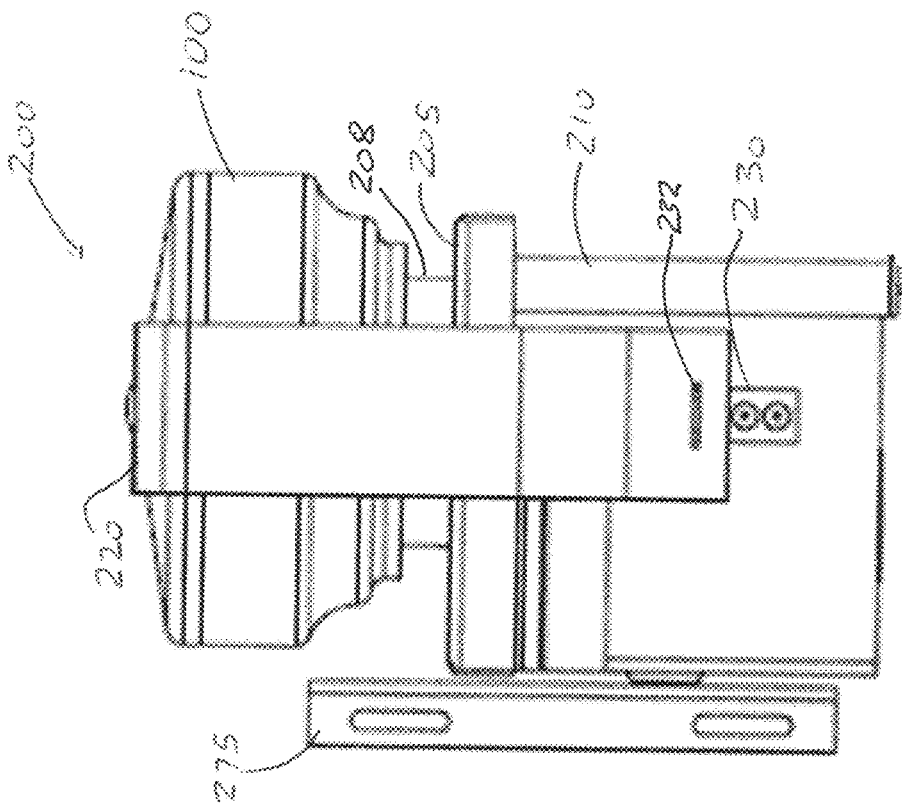
FIG. 2E illustrates a side view of a smart pole meter and socket assembly opposite to the side of FIG. 2D in accordance with some embodiments of the invention.
Figure 2D:
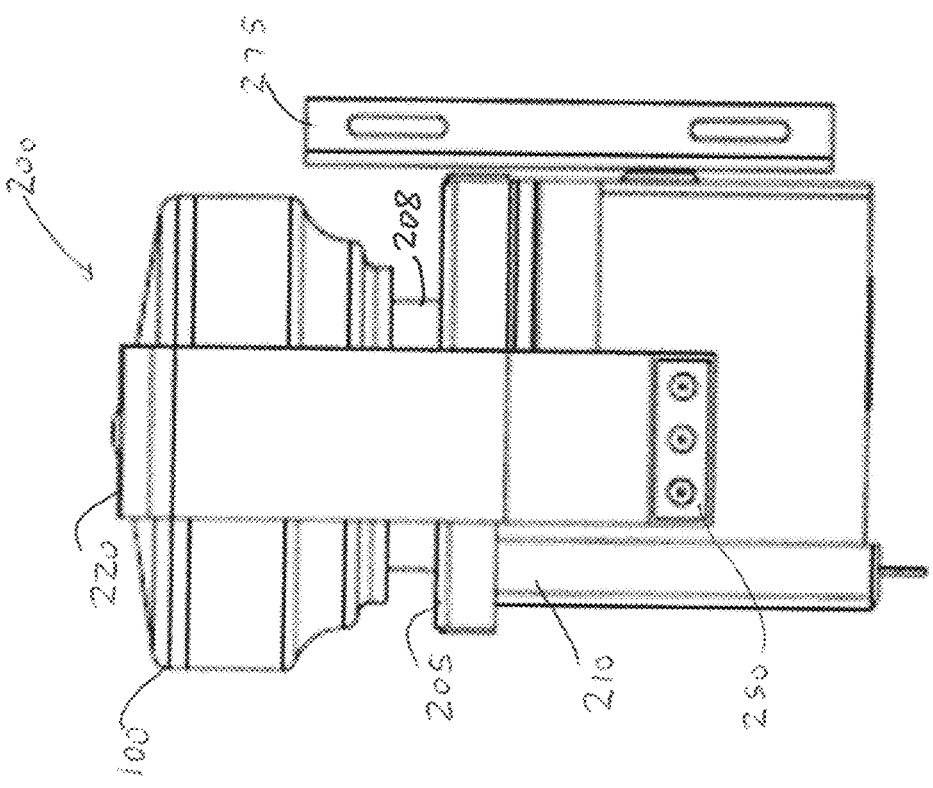
FIG. 2D illustrates a side view of a smart pole meter and socket assembly in accordance with some embodiments of the invention.
Figure 2G:
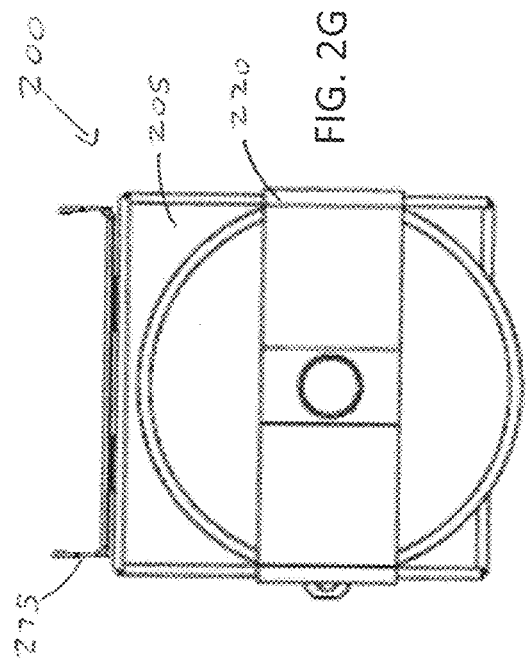
FIG. 2G illustrates a top view of a smart pole meter and socket assembly in accordance with some embodiments of the invention.
Figure 2H:
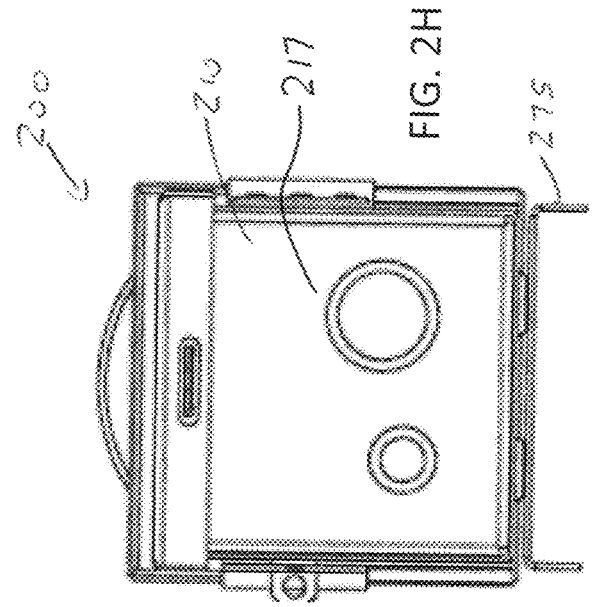
FIG. 2H illustrates a bottom view of a smart pole meter and socket assembly in accordance with some embodiments of the invention.
Figure 2F:
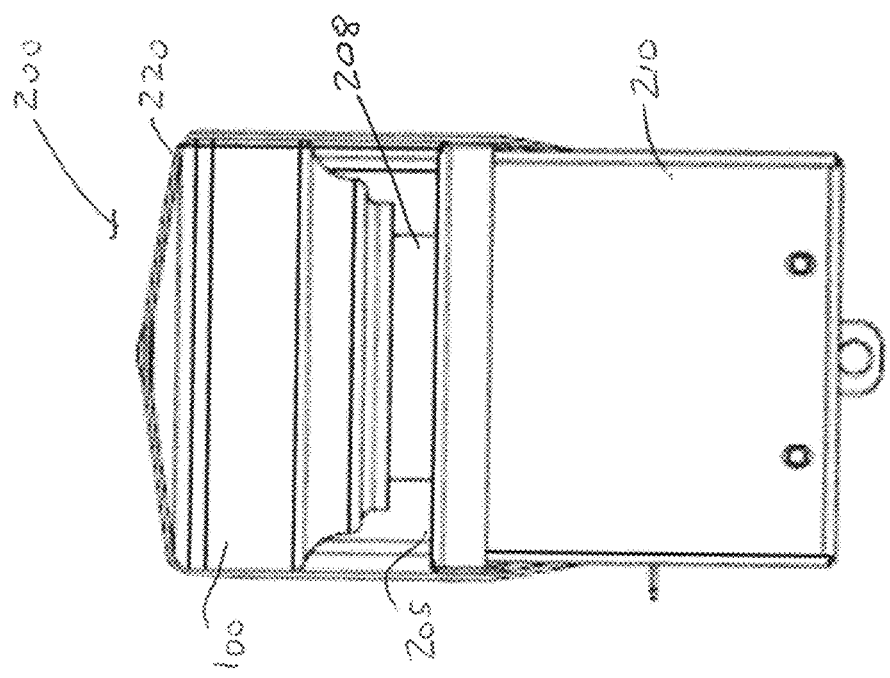
FIG. 2F illustrates a rear view of a smart pole meter and socket assembly in accordance with some embodiments of the invention.

FIGS. 2B-2H illustrate various perspective views of a smart pole meter and socket assembly 200 in accordance with some embodiments of the invention. In some embodiments, the smart pole meter and socket assembly 200 can comprise a smart self-contained pole meter 100 coupled to a socket 210. For example, in some embodiments, the smart pole meter and socket assembly 200 can include a meter 100 plugged into or otherwise coupled to a socket interface 208 extending from a top side 205 of the socket 210. In some embodiments, the smart self-contained pole meter 100 can comprise the smart self-contained pole meter 99. In some embodiments, the smart self-contained pole meter 100 can comprise the smart self-contained pole meter 99 within the grills, vents, or apertures 130. In some embodiments, the smart self-contained pole meter 100 can comprise all of the elements of the smart self-contained pole meter 99 where the illustrations of FIGS. 2B-2H show the grills, vents, or apertures 130 missing for the purposes of illustration only. FIGS. 2B-2C illustrate perspective views of a smart pole meter and socket assembly 200 in accordance with some embodiments of the invention. FIG. 2D illustrates a side view of a smart pole meter and socket assembly 200 in accordance with some embodiments of the invention. Further, FIG. 2E illustrates a side view of a smart pole meter and socket assembly 200 opposite to the side of FIG. 2D in accordance with some embodiments of the invention. FIG. 2F illustrates a rear view of a smart pole meter and socket assembly 200 in accordance with some embodiments of the invention, and FIG. 2G illustrates a top view of a smart pole meter and socket assembly 200 in accordance with some embodiments of the invention. FIG. 2H illustrates a bottom view of a smart pole meter and socket assembly 200 in accordance with some embodiments of the invention. As compared to the pedestal shown in FIG. 1B, some embodiments of the adapter can comprise a compact architecture that is not stand-alone, requires minimal space, and has low construction costs.

In some embodiments, at least one hold-down strap can be implemented for securing the meter 100 to a meter socket 210. In some embodiments, a hold-down strap can be positioned over the meter 100, with each end of the strap secured to opposite sides of the socket. In some embodiments, the hold-down strap can be pre-bent to an approximate final shape for ease of installation. In some embodiments, the socket 210 can include a strap-latch for securing one end of the hold-down strap to one side of the socket 210.

In some embodiments, two strap latches can be used, one positioned on each side of the meter socket. In some embodiments, the strap latch can be riveted to the enclosure of the socket. In some embodiments, a tamper-resistant seal location can be coupled to the strap latch. In some embodiments, the opposite end of the hold-down strap can be secured to the meter socket using a riveted weather sealed metal plate. In some further embodiments, a pole bracket can be coupled to one side of the enclosure. The bracket can be used as an attachment structure enabling the meter socket and meter to be mounted to another structure or surface. For example, referring to FIGS. 2B and 2C, in some embodiments, the smart pole meter and socket assembly 200 includes a tie-down strap 220. In some embodiments, the tie-down strap 220 can extend over the meter 100 from one side of the socket 210 to an opposite side of the socket 210. For example, as shown in FIG. 2C, in some embodiments, the tie-down strap 220 can coupled to a plate 250 on one side of the socket 210. In some embodiments, the tie-down strap 220 can be riveted to the plate 250. In other embodiments, any conventional coupling mechanism can be used to couple the tie-down strap 220 to the plate 250.

In some embodiments, the tie-down strap 220 can extend over the meter 100 and couple to a strap-latch 230 (shown in FIG. 2B). In some embodiments, the tie-down strap 220 can be riveted to the strap-latch 230. In other embodiments, any conventional coupling mechanism can be used to couple the tie-down strap 220 to the strap-latch 230. In some embodiments, the tie-down strap 220 can comprise metal or metal alloy. In some further embodiments, the tie-down strap 220 can comprise a polymer such as polyethylene. For example, in some embodiments, the tie-down strap 220 can comprise marine-grade high-density polyethylene.

In some embodiments, the strap-latch 230 can comprise a tamper-resistant seal. For example, some embodiments include a seal 232 that can be threaded through an aperture in the tie-down strap 220. The non-limiting embodiment of FIGS. 2B-2C shows a single tie-down strap 220, however any number of tie-down straps 220 can be used. Further, a single strap-latch 230 and plate 250 is shown, whereas any number of single strap-latches 230 and plates 250 can be used and positioned on the sides shown or one or more of the other sides of the socket 210. Further, the non-limiting embodiment of FIGS. 2B-2C shows a tie-down strap 220 of the width that can be increased or decreased from that shown. Further, the tie-down strap 220 can comprise or include other sections or conventional coupling elements for wrapping, coupling or attaching to the meter 100. In some embodiments, the smart pole meter and socket assembly 200 in include one or more attachment plates. For example, some embodiments include an attachment plate 275 coupled to one side of the socket 210. In some embodiments, the attachment plate 275 can be used to mount or otherwise couple the socket 210 to a structure or surface. In some further embodiments, the socket 210 can include one or more apertures for coupling to electrical and/or signal wiring. For example, in reference to FIG. 2H, some embodiments include apertures 217.

In one non-limiting embodiment, the smart pole meter 99 of FIG. 2A and/or the assembly 200 of FIGS. 2B-2H can include a controller, and power parameters metered or measured with an accuracy of about 0.5%. In some embodiments, the power supply can include a universal AC input of about 85V to 264V, 50/60 Hz in some embodiment. In some embodiments, the radio controller can include a processor that can be an ARM 7 with RAM memory of 8 MB, FLASH memory of 16 MB and network parameters of about 50-300 kbps, a frequency range of about 902-928 MHz, spread spectrum frequency hopping, transmitter output of about 27-30 dBm (1 W), −98 dBm for 10% PER, and an operating protocol of 802.15.4.g.

In one non-limiting embodiment, the smart pole meter 99 of FIG. 2A and/or the meter 100 and assembly 200 of FIGS. 2B-2H can include security addressing that can be IPv6, advanced encryption standard (AES-128 or AES-256), secure hash algorithm 256-bit (SHA-256) and RSA-1024 or ECC-256, and secure NVRAM with tamper detection and key erasure. Further, some embodiments include surge protection standard: 445 Joule CATB (6 kV/3 kA), optional 700 Joule CATC (20 kV/10 kA), and the operating conditions can include a range of about −400 C to + of 0° C./−400° F. to +1580° F., about 20% to 90% Rh non-condensing; IP66, and can be RoHS compliant. In some embodiments, web-based software can allow remote configuration, monitoring, control, and reporting.

Figure 2J:
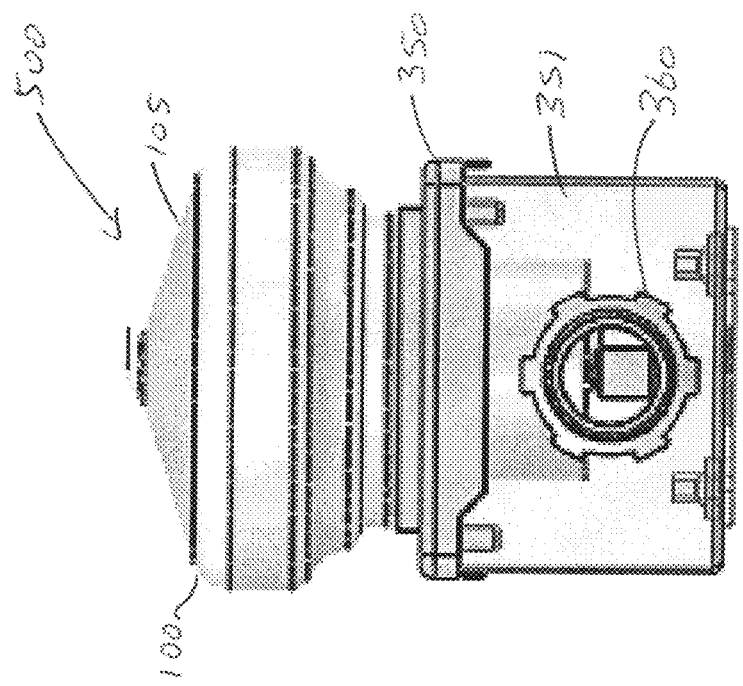
FIG. 2J illustrates a side view of a transformer-rated meter socket/meter assembly with coupled smart meter in accordance with some embodiments of the invention.
Figure 2I:
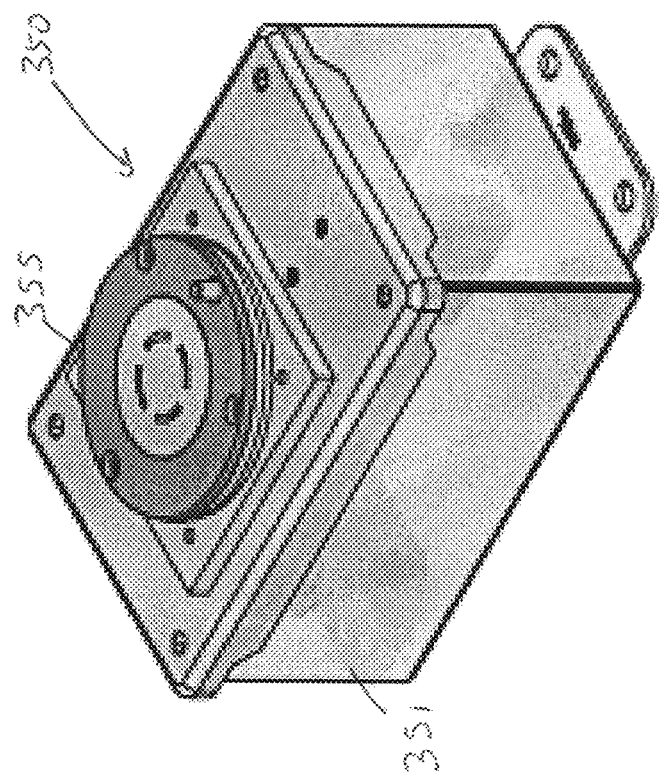
FIG. 2I illustrates a top perspective view of a transformer-rated meter socket in accordance with some embodiments of the invention.

FIG. 2I illustrates a top perspective view of a transformer-rated meter socket 350 in accordance with some embodiments of the invention, and FIG. 2J illustrates a side view of a transformer-rated meter socket/meter assembly 500 with coupled smart meter 100 in accordance with some embodiments of the invention. As shown, in some embodiments, the meter socket 350 can include a main housing 351 comprising an electrical box with a socket interface 355 that can provide a coupling point for at least one electric meter end point hardware assembly (e.g., meter 100). Consequently, in some embodiments, the meter socket 350 that can function as a hub, receptacle, and/or contact point for one or more further components of an electric metering system. In some embodiments, the meter 100 does not include a display. In some embodiments, the accuracy of the meter can be analyzed by polling read from an AMI network communication card configured to remotely send energy usage back to a head-end system. In some embodiments, the ampere rating can be unlimited with step down current transformers (i.e., 50:5, 100:5, 150:5, 200:5, 300:5, 400:5, 500:5, 600:5, 700:5, 800:5, 900:5, 1000:5, etc.).

In some embodiments, the smart pole meter can be coupled in close proximity to a transformer. In some embodiments, the transformer-rated smart pole meter socket can comprise an assembly that can be used to mount a transformer-rated meter, typically used in smart pole applications. In some embodiments, the assembly can comprise a current transformer with a ratio of between 50:5 and 200:5, an electrical box, a custom 4 pole meter socket with automatic current transformer ("CT") shunt circuit, and a mounting plate, which can be adapted to any mounting hole pattern. In some embodiments of the invention, the current transformer can be mounted directly to the mounting plate, above the meter socket electrical box. The CT is used to step down the service current from up to 200 A to 5 A. The 5 A secondary is required to bring the measured current down to a level suitable for the meter to measure. The electrical box houses the wiring required to get the voltage and current to the meter socket, and then to the meter. In some embodiments, the meter socket comprises a modified ANSI 19-20 twist-lock female four pole connector. The connector is physically modified on the upper section to allow clearance for the bottom face of the meter. It is also mechanically modified to allow for two redundant custom designed plunger switches to protrude through the top of the connector. The connector can be rated for 480VAC and 20AAC or other voltage ranges.

Figure 3A:
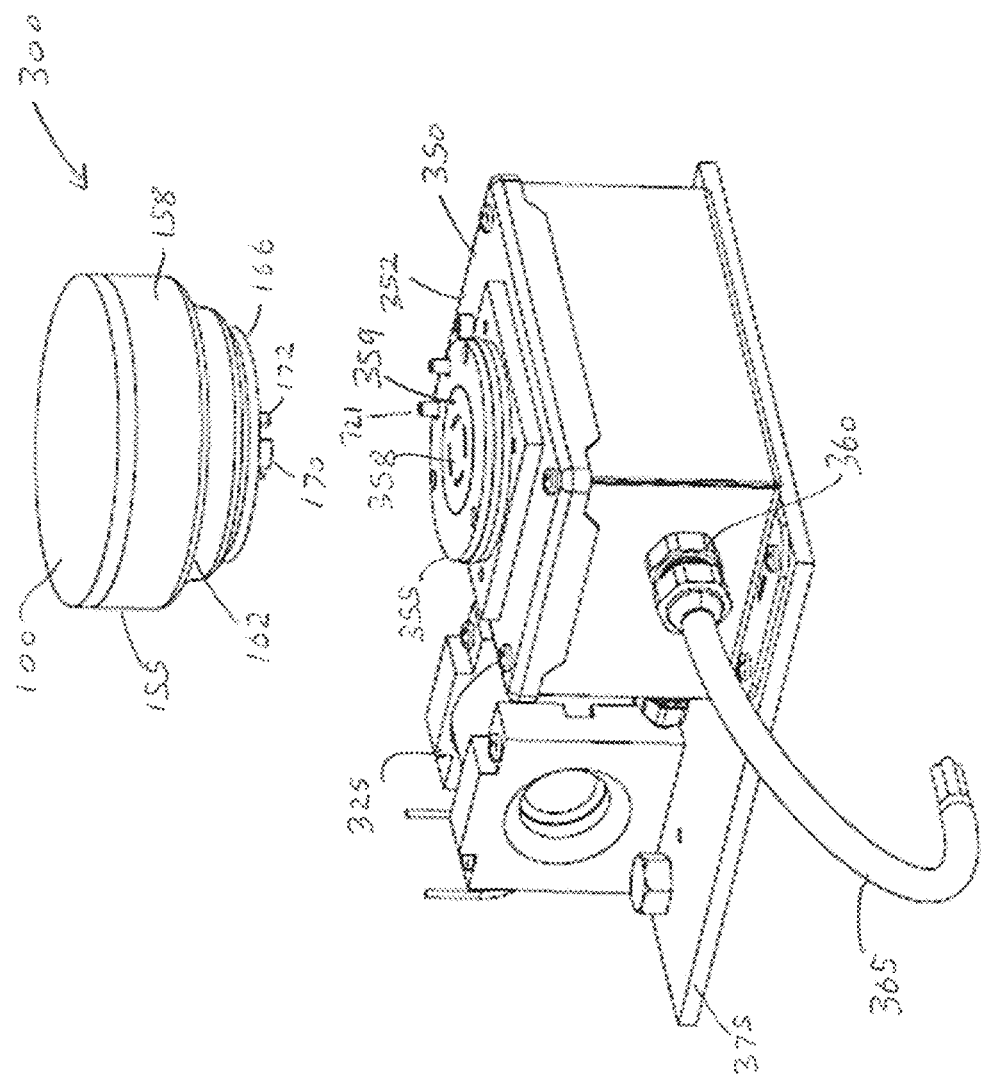
FIG. 3A illustrates an exploded assembly view of a small foot print metering solution including a transformer-rated meter socket assembly in accordance with some embodiments of the invention.

In some embodiments, an assembly, such as a meter socket assembly, can be used to mount a transformer-rated meter (e.g., such as a smart meter typically used in smart pole applications). In some embodiments, the assembly can be made up of a current transformer, having a ratio of between 50:5 and 200:5; an electrical box; a custom 4 pole meter socket with automatic current transformer shunt circuit, and a mounting plate, which can be adapted to any mounting hole pattern. In some embodiments, the current transformer can be mounted directly to the mounting plate, above the meter socket electrical enclosure. In some embodiments, the current transformer can be used to step down the service current from up to 200 A to 5 A. The 5 A secondary is required to bring the measured current down to a level suitable for the meter to measure. In some embodiments, the electrical box can house the wiring required to get the voltage and current to the meter socket, and then to the meter. In some embodiments, the meter socket can be made up of a modified ANSI 19-20 twist-lock female four pole connector. In some embodiments, the connector can be physically modified on the upper section to allow clearance for the bottom face of the meter. Further, in some embodiments, it can be mechanically modified to allow for two redundant custom designed plunger switches to protrude through the top of the connector. In some embodiments, the connector can be rated for 480VAC and 20AAC. For example, FIG. 3A illustrates an exploded assembly view of a small foot print metering solution 300 including a transformer-rated meter socket assembly 305 (shown in exploded assembly view with meter 100) in accordance with some embodiments of the invention. In some embodiments, the meter socket assembly 305 can include a platform 375 supporting at least one transformer 325 and/or at least one socket 350. In some embodiments, the at least one transformer 325 and/or at least one socket 350 can be coupled to the platform 375. Further, in some embodiments, the meter socket assembly 305 can include a power receptacle 360 and wiring 365 coupled to the receptacle 360. In some embodiments, the meter 100 can comprise a housing 155 including an upper portion 158 coupled to a lower portion 162. Further, in some embodiments, the meter 100 can comprise a socket interface 166 and a plug assembly 170 extending from the interface 166. In some embodiments, the meter 100 can be coupled to a socket interface 355 extending from the upper housing 352 of the socket 350. For example, in some embodiments, the meter 100 can be coupled to the socket 350 by inserting one or more prongs 172 into one or more inlets 358 of an adaptor socket 359 of the socket interface 355.

Figure 3C:
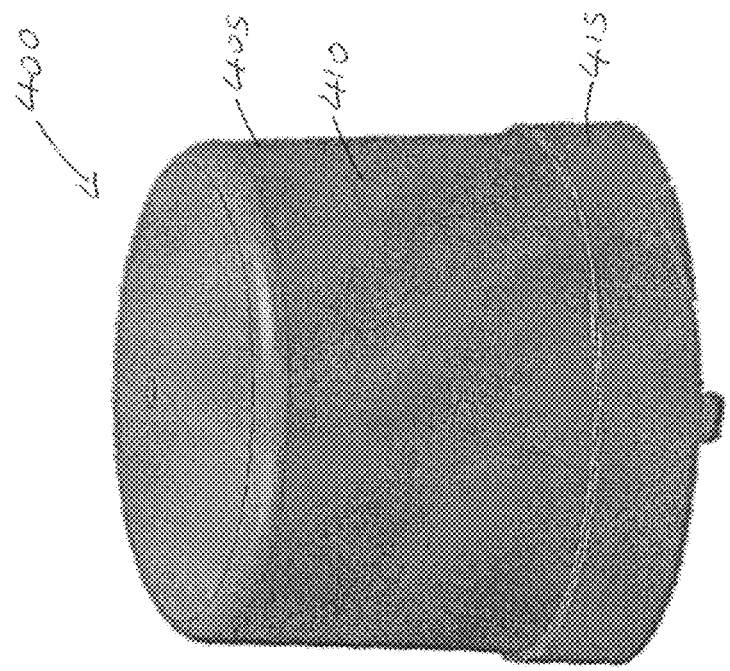
FIG. 3C illustrates a side perspective view of smart pole meter in accordance with some embodiments of the invention.
Figure 3B:
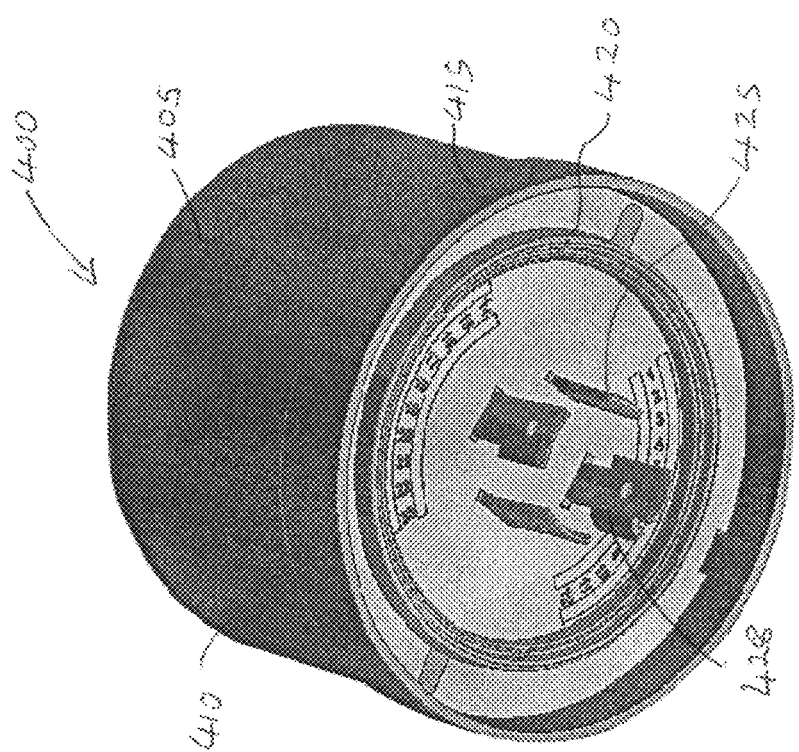
FIG. 3B illustrates a bottom perspective view of smart pole meter in accordance with some embodiments of the invention.

In some embodiments of the invention, the meter 100 can comprise the smart meter shown in FIGS. 3B-3C. For example, FIG. 3B illustrates a bottom perspective view of smart pole meter 400 in accordance with some embodiments of the invention, and FIG. 3C illustrates a side perspective view of smart pole meter 400 in accordance with some embodiments of the invention. In some embodiments, the meter 400 can comprise a housing 405 including an upper portion 410 coupled to a lower portion 415. Further, in some embodiments, the meter 400 can comprise a socket interface 420 and a plug assembly 425 extending from the interface 420. In some embodiments, the meter 400 can be coupled to a socket interface (e.g., such as interface 355 extending from the upper housing 352 of the socket 350). For example, in some embodiments, the meter 400 can be coupled to the socket 350 by inserting one or more prongs 428 into one or more inlets 358 of the socket interface 355.

Figure 3D:
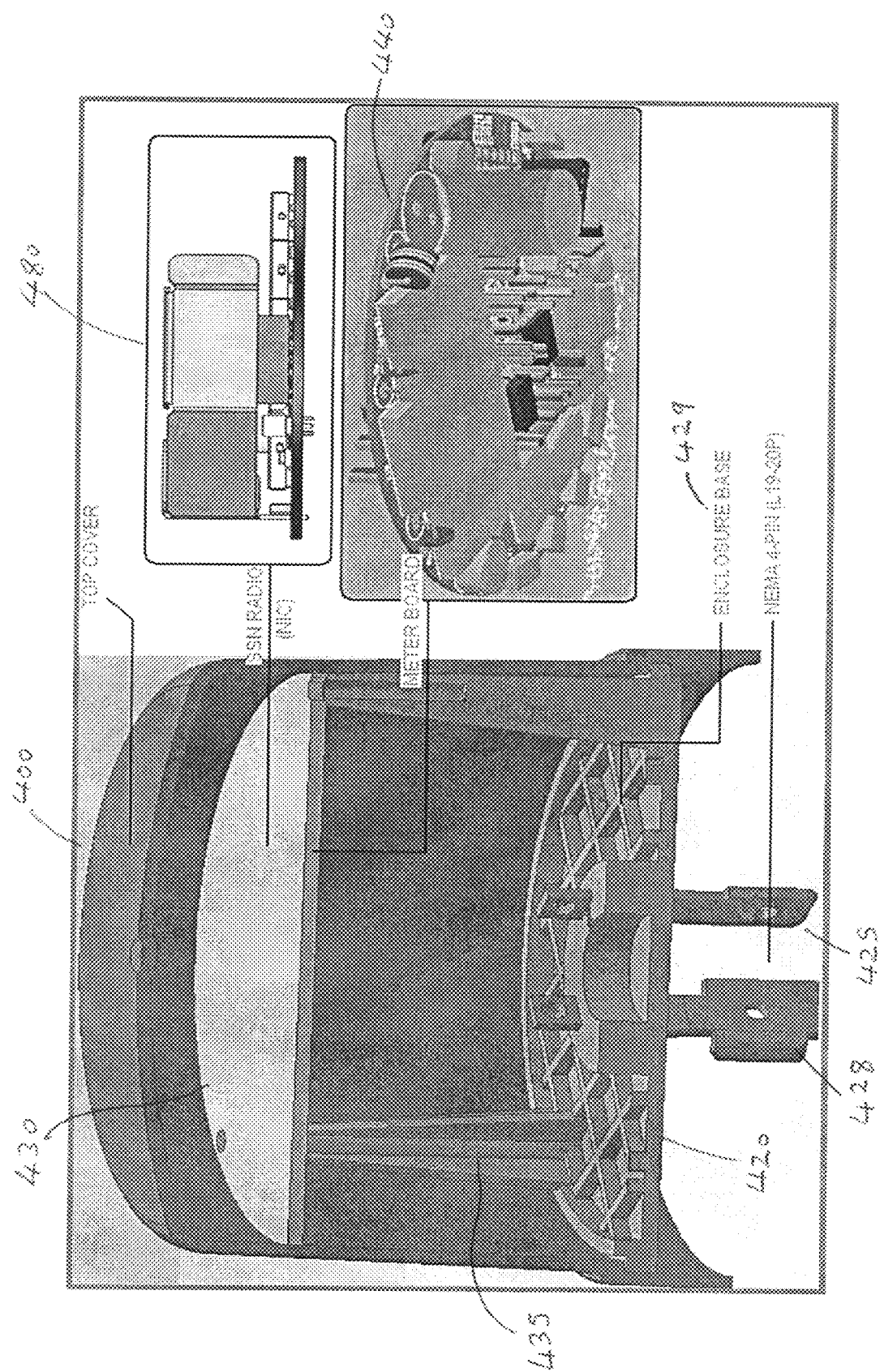
FIG. 3D illustrates a cross-section and internal component view of the smart pole meter of FIGS. 3B-3C in accordance with some embodiments of the invention.

FIG. 3D illustrates a cross-section and internal component view of the smart pole meter 400 of FIGS. 3B-3C in accordance with some embodiments of the invention. In some embodiments, the interface 420 includes enclosure base 429 supporting a meter board 440 with one or more supports 435 extending from adjacent one end of the meter 400 towards the other end of the meter 400. In some embodiments, the meter board 440 can include and/or support at least one network interface card including a radio or other wireless received or transceiver (shown as 480). In some embodiments, the meter 400 can comprise a wireless single phase transformer rated (120V and 240V) "smart pole" power meter designed to measure power consumption of equipment attached to, or contained within, a streetlight pole. In some embodiments, the meter can include a "microcell" low power cellular base station or electronic vehicle charger(s). In some embodiments, data collected by the meter is transmitted back to the central management or metering system (UIQ) via a self-forming, self-healing wireless mesh network. In some embodiments, the meter is designed for greater than 15 A max using the input current from a step down current transformer (CT), rated as primary/secondary current such as 50 A/5 A. In some embodiments, the current transformer can be internally located within power sockets. In some embodiments, the "smart" meter can include four NEMA prongs to mount to the power socket, where two prongs can act as an input for line voltage, and two prongs can have input for current. In some embodiments, the two voltage inputs and two current inputs can be used solely for the purpose of metering consumption data rather than controlling equipment so output from this device is not required Table 1 outlines the technical specifications for one embodiment of the transformer-rated meter 400 shown in FIGS. 3B and 3C.

TABLE 1

| | transformer-rated meter specifications | | | | | |
|---|---|---|---|---|---|---|
| OUTPUT | DC VOLTAGE | 3.3 V | 5 V | 12 V | 15 V | 24 V |
| | RATED CURRENT | 2.5 A | 2 A | 0.85 A | 0.67 A | 0.42 A |
| | CURRENT RANGE | 0~2.5 A | 0~2 A | 0~0.85 A | 0~0.67 A | 0~0.42 A |
| | RATED POWER | 8.25 W | 10 W | 10.2 W | 10.05 W | 10.08 W |
| | RIPPLE & NOISE (max.) | 200 mVp-p | 200 mVp-p | 200 mVp-p | 200 mVp-p | 200 mVp-p |
| | VOLTAGE TOLERANCE Note. 3 | ±2.5% | ±2.5% | ±2.5% | ±2.5% | ±2.5% |
| | LINE REGULATION | ±0.3% | ±0.3% | ±0.3% | ±0.3% | ±0.3% |
| | LOAD REGULATION | ±0.5% | ±0.5% | ±0.5% | ±0.5% | ±0.5% |
| | SETUP, RISE TIME | 600 ms, 30 ms at Full load | | | | |
| | HOLD UP TIME (Typical) | 30 ms/230 VAC 8 ms/115 VAC at Full load | | | | |
| INPUT | VOLTAGE RANGE | 85~264 VAC 120~370 VDC | | | | |
| | FREQUENCY RANGE | 47~440 Hz | | | | |
| | EFFICIENCY (Typical) | 74% | 77% | 82% | 82% | 82% |
| | AC CURRENT (Typical) | 0.25 A/115 VAC 0.15 A/230 VAC | | | | |
| | INRUSH CURRENT (Typical) | COLD START 20 A/115 VAC 40 A/230 VAC | | | | |
| | LEAKAGE CURRENT | <0.25 A/240 VAC | | | | |
| PROTECTION | OVERLOAD | 115%~190% rated output power | | | | |
| | | Protection type: hiccup mode, recovers automatically after fault condition is removed | | | | |
| | OVER VOLTAGE | 3.8~4.95 V | 4.75~6.75 V | 13.8~16.2 V | 17.25~20.25 V | 27.6~32.4 V |
| | | Protection type: Shut off o/p voltage, clamping by zener diode | | | | |
| ENVIRONMENT | WORKING TEMPERATURE | −30~+70° C. (Refer to "Derating Curve") | | | | |
| | WORKING HUMIDITY | 20~90% RH non-condensing | | | | |
| | STORAGE TEMPERATURE, HUMIDITY | −40~+80° C., 10~95% RH | | | | |
| | TEMPERATURE COEFFICIENT | ±0.03%/° C. (0~50° C.) | | | | |
| | VIBRATION | 10~500 Hz, 5G 10 min/1cycle, period for 60 min, each along X, Y, Z axis | | | | |
| SAFETY & EMC | SAFETY STANDARDS | UL60950-1, TUV EN60950-1 approved | | | | |
| | WITHSTAND VOLTAGE | I/P-O/P: 3 KVAC | | | | |
| | ISOLATION RESISTANCE | I/P-O/P: 100M Ohms/500 VDC/25° C./70% RH | | | | |
| | EMC EMISSION | Compliance to EN55022 (CISPR22) Class B, EN61000-3-2,-3 | | | | |
| | EMC IMMUNITY | Compliance to EN61000-4-2,3,4,5,6,8,11 EN55024, heavy industry level (Surge L-N: 1 KV), criteria A | | | | |
| OTHERS | MTBF | 1495.8 KHrs min. MIL-HDBK −217 F. (25° C.) | | | | |
| | DIMENSIONS | 47.7 * 25.4 * 21.5 mm (L * W * H) | | | | |
| | PACKING | 0.04 Kg: 270pcs//11.8 Kg/0.97 CUFT | | | | |

In some embodiments, the meter 400 can be configured for remote monitoring enabling an RF network to send captured meter data back to a central monitoring system. In some embodiments, the meter 400 can include a NIC451 board from Silver Spring Networks, Redwood City, Calif. In some embodiments, the smart pole meter 400 can include an network communication card to remotely send energy usage back to a head-end system (e.g., such as a network communication card from American Megatrends, Inc.)

In some embodiments, the meter 400 can include power metering. In some embodiments, the meter 400 can monitor electrical parameters such as current, voltage, frequency, power factor, kW and kWh with an accuracy of 0.2%. For example, some embodiments include an on-chip metering engine that can provide a value to the NIC451 board upon request. Some embodiments include instant power measurement where the meter starts measuring power parameters the moment it is powered on. Some further embodiments include over-the-air upgrade capability, where the meter's host controller firmware can be upgraded over the air. In some embodiments, the meter's microcontroller can be a 16-bit microcontroller with the following specifications: a modified "Harvard Architecture" with up to 16 MIPS operation @ 32 MHz, 8 MHz internal oscillator, 4×PLL option, multiple divide options, 17-bit×17-bit single-cycle hardware, fractional/integer multiplier, 32-bit by 16-bit hardware divider, 16×16-bit working register array, C compiler optimized instruction set architecture, 76 base instructions, flexible addressing modes, linear program memory addressing up to 8 Mbytes with unlimited number of ota-programmable data channels until memory is exhausted, linear data memory addressing up to 64 Kbytes with unlimited number of OTA-programmable data channels until memory is exhausted, and two address generation units for separate read and write addressing of data memory.

Figure 4:
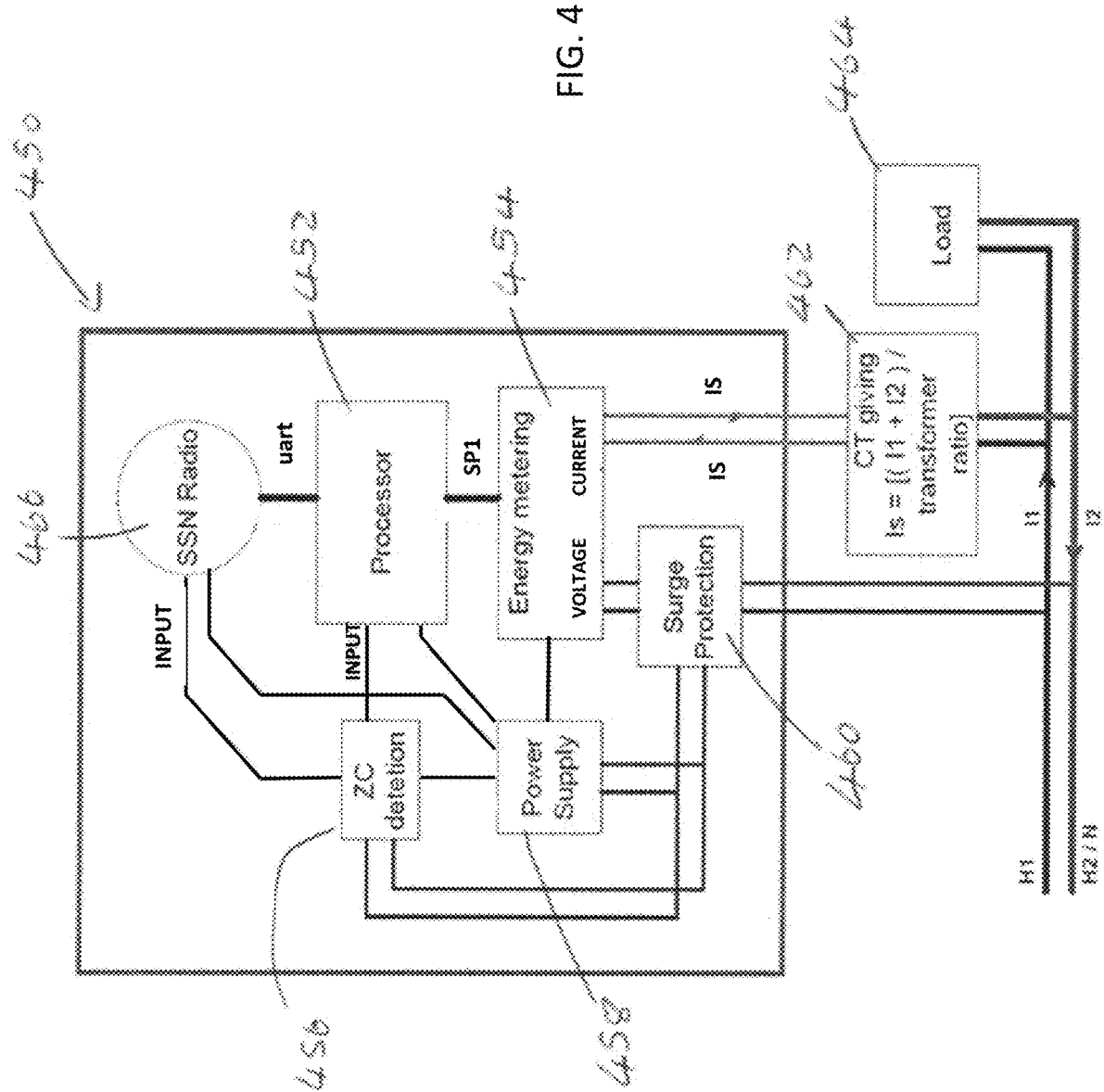
FIG. 4 illustrates meter interface design in accordance with some embodiments of the invention.

FIG. 4 illustrates meter interface design 450 in accordance with some embodiments of the invention. In some embodiments, the design 450 includes a circuit comprising processor 452, "SSN radio" 466, power supply 458, ZC detection 456, energy metering 454, surge protection 460, CT input 462, and load 464. In some embodiments, the NIC451 board couples directly to a standard physical interface to the meter's 16-bit processor through a universal asynchronous receiver/transmitter ("UART"). In some embodiments, there is buffer between UARTs of both SSN & processor. ZC signal (detection 456) can be derived from 50/60 Hz AC supplies by use of opto-isolator. This physical interface/pin can be used for other third party telecommunication modules provided all its connection details match to 12-pin connector of SSN in terms of power, signal levels, voltage levels, mechanical pin sequence & any other characteristics. In some embodiments, there are 4-pins as per the L19-20P, out of which two will be for the voltage input and two will be for the current input. In some embodiments, voltage input can be single phase 240VAC or dual phase split type supply. In some embodiments, two current pins can receive output of current transformer. In some embodiments, the smart pole meter 400 does not include a display, although a display can be included as required or specified by a user. In some embodiments, the ampere rating can be 15 A maximum continuous.

In some embodiments, a transformer-rated pole meter socket and transformer assembly can include a CT shunt circuit. The purpose of this mechanism is to allow for the safe removal of the meter from the socket. If this circuit were not in place, dangerous voltages could be present at the socket/meter connection at the point of first contact breakage (up to 4800V), caused by an open CT secondary. In normal socket based meter applications, this function is performed with mechanical test switches. In some embodiments, the CT shunt circuit can comprise two redundant plunger switches, each of which are spring loaded to allow an plunger actuator shaft to protrude through the top of the connector housing and make contact with the plastic base of the meter. In some embodiments, when the meter is seated into the connector, the plunger switch actuators can be pushed into the switch assembly, causing the springs to be compressed. In some embodiments, the actuator motion can cause machined cams in the shaft of the plunger to be pushed down and off spring loaded roller arms on two redundant electrical switches. In some embodiments, as the cams move off the roller arms of the switches, the contacts on the two switches can move from a closed to an open state. In some embodiments, the switch contacts are wired in parallel for redundant safety purposes. In some embodiments, when the switch contacts open, current can flow from the CT secondary to the meter current elements. In some embodiments of the invention, when the meter is being removed (e.g., by an electrical technician), the technician will first rotate the meter, and then lift the meter up and out of the socket. As the meter is raised off the top face of the connector, but before the connector contacts of the meter disengage from the contacts of the meter socket, the plunger cam can move up to the point where the roller arms of the switches are pushed back to the position that causes the switch contacts to close, shunting the secondary current from the CT safely to ground.

Figure 5:
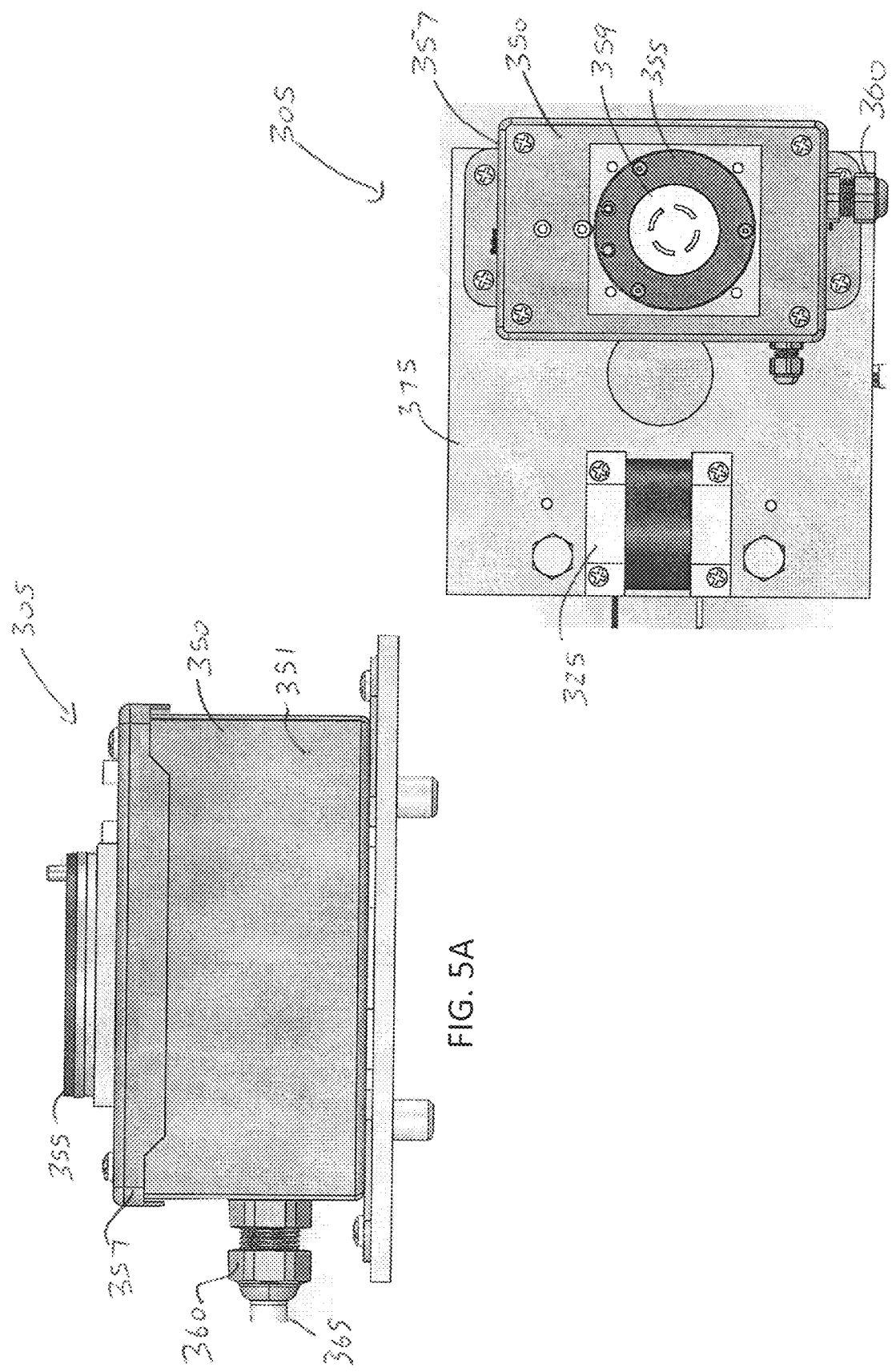
FIG. 5A illustrates a side view of a transformer-rated meter socket assembly in accordance with some embodiments of the invention.
FIG. 5B illustrates a top view of a transformer-rated meter socket assembly in accordance with some embodiments of the invention.
Figure 6:
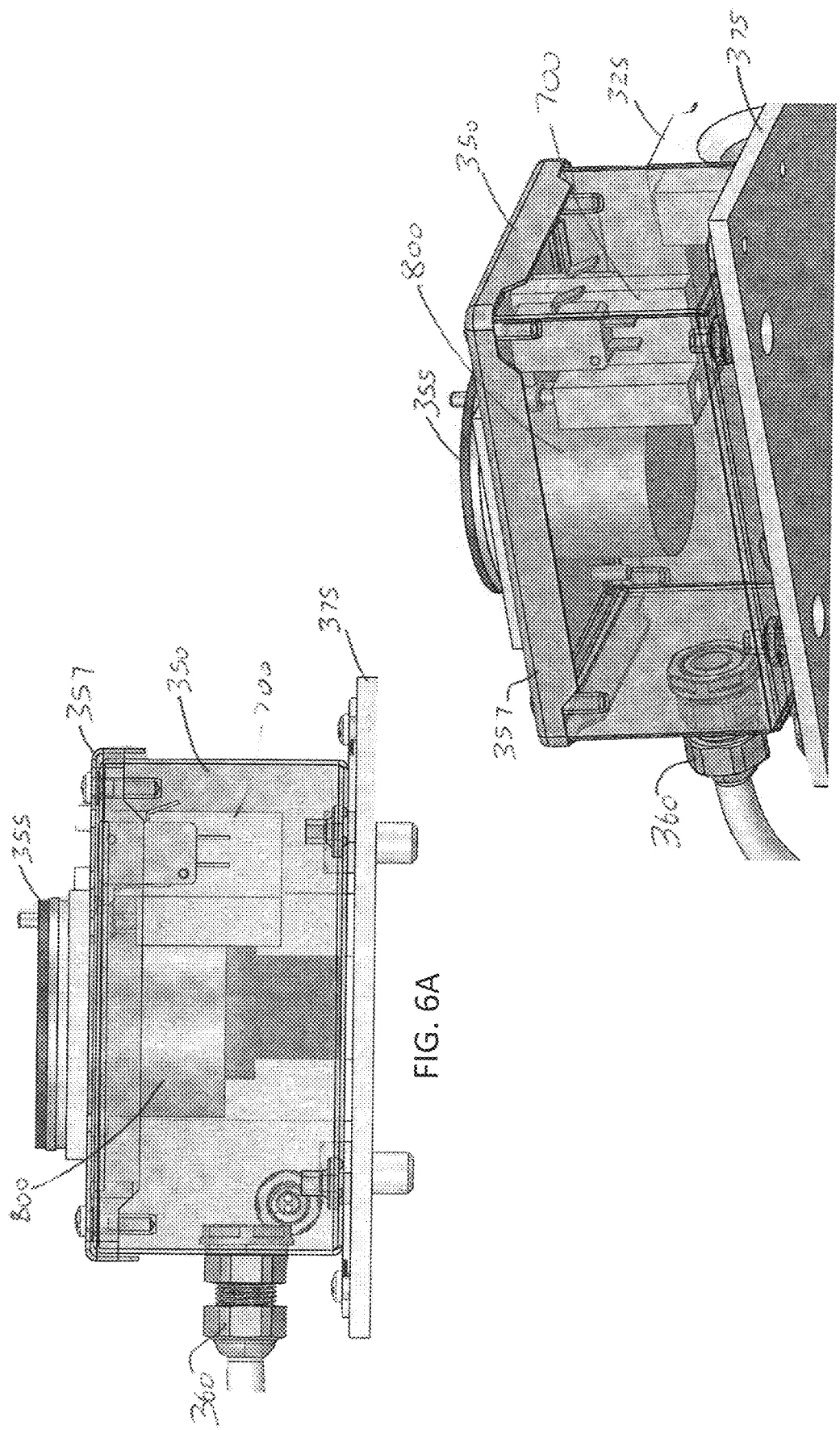
FIG. 6A illustrates a partially transparent internal side view of a transformer-rated meter socket assembly in accordance with some embodiments of the invention.
FIG. 6B illustrates a bottom side perspective partially transparent view of a transformer-rated meter socket assembly in accordance with some embodiments of the invention.

Referring to FIG. 5A, illustrating a side view of a transformer-rated meter socket assembly 305 in accordance with some embodiments of the invention, the transformer-rated pole meter socket 350 is shown coupled to the platform 375, with power receptacle 360 and wiring 365 coupled to the receptacle 360 coupled to one end of the main housing 351 which houses the wiring required to get the voltage and current to the socket interface 355. Further, FIG. 5B illustrates a top view of a transformer-rated meter socket 350 in accordance with some embodiments of the invention, and FIG. 6A illustrates a partially transparent internal side view of a transformer-rated meter socket 350 in accordance with some embodiments of the invention. In some embodiments, the socket interface 355 includes an adapter socket 359 at one end of a secondary housing 800 including a CT shunt as discussed above. (See FIGS. 7-8, and 9A-9B below for descriptions related to components of the secondary housing 800 and CT shunt.) FIG. 6B illustrates a bottom side perspective partially transparent view of a transformer-rated meter socket 350 in accordance with some embodiments of the invention. In some embodiments, the current transformer 325 can be mounted directly to the platform 375 at some distance from the meter socket 350 and adjacent a plunger switch assembly. In some embodiments, the transformer assembly and transformer-rated pole meter socket can be mounted closer than shown or in other orientations.

Figure 7:
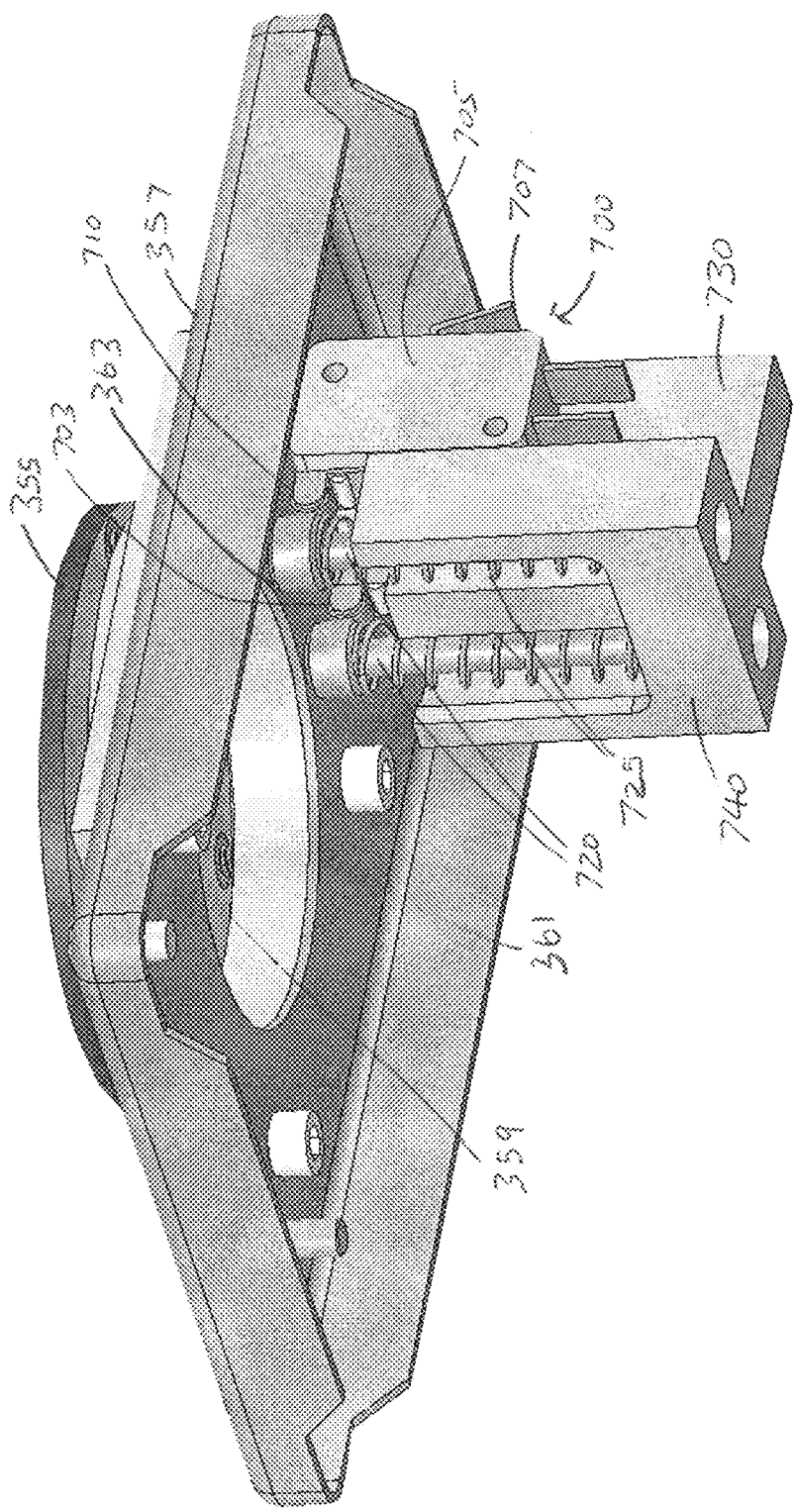
FIG. 7 illustrates a perspective view of a plunger switch attached on a socket face in accordance with some embodiments of the invention.
Figure 8:
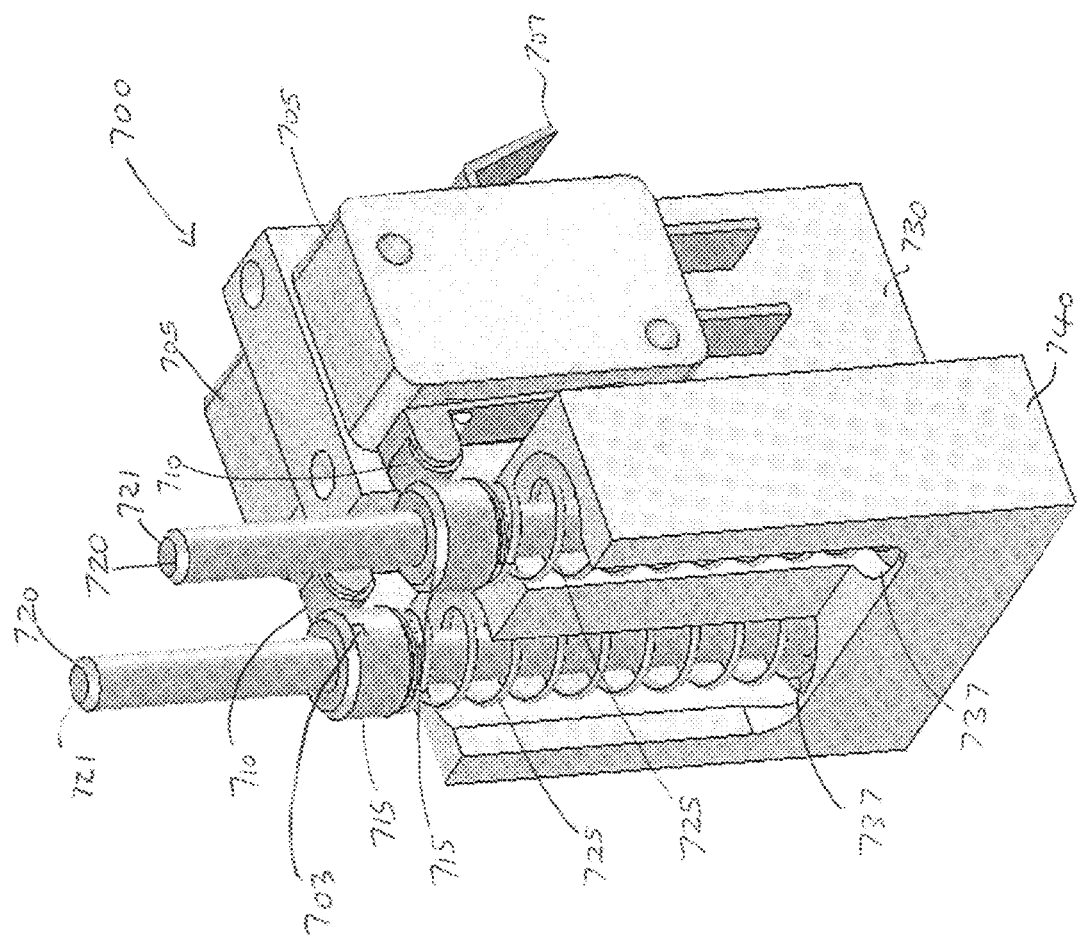
FIG. 8 illustrates a perspective view of a plunger switch assembly in accordance with some embodiments of the invention.

Some embodiments of the invention include one or more safety devices. For example, FIG. 7 illustrates a perspective view of a plunger switch assembly 700 attached on adaptor socket 359 in accordance with some embodiments of the invention. In some embodiments, the plunger switch assembly 700 can comprise components of a CT shunt circuit that can include two spring loaded plunger switches 703 comprising generally identical assemblies including plunger actuator shafts 720 configured to couple to CT shunts 705 via roller contacts 710. In some embodiments, each plunger actuator shaft 720 is positioned in a plunger housing 740 with one end supported in a cavity 737, and the opposite end 721 protruding through aperture 363 in the top housing 361 of the adapter socket 359. The plunger actuator shafts 720 are shown adjacent to shunts 705 that include electrical contacts 707 and roller contacts 710 that can couple and decouple from the plunger actuator shafts 720. For example, FIG. 8 shows plunger switch assembly 700 with roller contacts 705 in accordance with some embodiments of the invention. In some embodiments, a CT shunt support 730 can extend from the plunger housing 740 that can support two CT shunts 705, each positioned on opposite sides of the CT shunt support 730. Further, each CT shunt 705 can be positioned adjacent a plunger actuator shaft 720 and can be configured to enable the roller contacts 705 to couple to and decouple from the contacts 715 of the plunger actuator shaft 720 based on force applied to the end 721 of the plunger actuator shafts 720, where each of the contacts 715 couple to and are supported by springs 725.

In some embodiments, when force is applied to the end 721 of a plunger actuator shaft 720, the plunger actuator shaft 720 can be forced towards the cavity 737 compressing the spring 725 through contact with the contacts 715. In some embodiments, when force is released or lessened from the end 721 of a plunger actuator shaft 720, the plunger actuator shaft 720 can be forced away from the cavity 737 as the spring 725 applies force to contacts 715. In some embodiments, as the meter 100 is coupled to socket interface 355 of adaptor socket 359 (e.g., see exploded assembly view of FIG. 3A), the meter 100 can mechanically couple to the plunger actuator shafts 720.

Figures 9A, 9B:
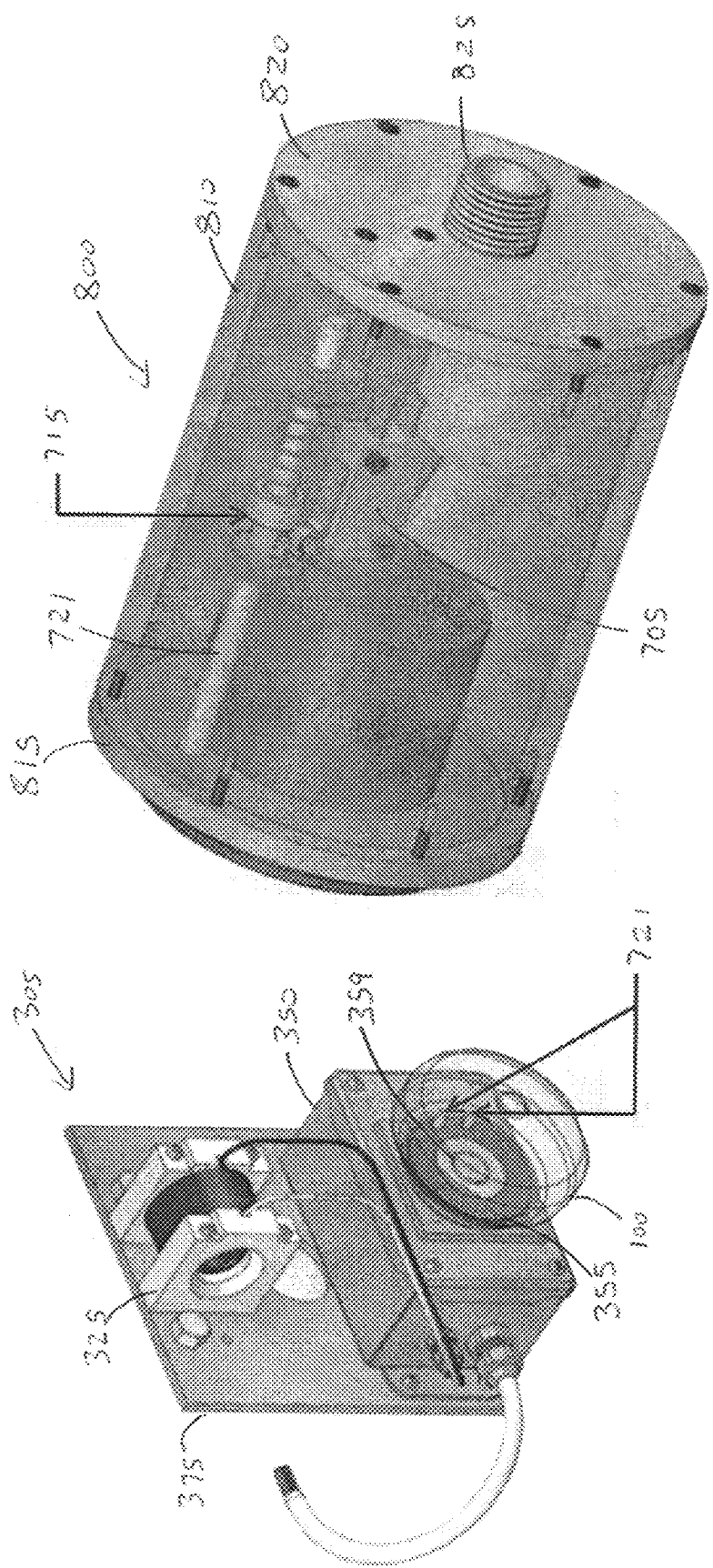
FIG. 9A illustrates a transformer-rated meter socket assembly in accordance with some embodiments of the invention.
FIG. 9B illustrates a partially transparent transformer-rated plunger switch in accordance with some embodiments of the invention.

FIG. 9A illustrates a transformer-rated meter socket assembly 305 in accordance with some embodiments of the invention, and shows the meter 100 as partially transparent revealing the ends 721 of the plunger actuator shaft 720 beneath the meter 100. When the meter 100 is positioned coupled to the socket interface 355, electrical current can flow to the meter 100, and when the meter 100 is separated from the socket interface 355 electrical can flow through the CT shunt 705. Further, the secondary housing 800 including a CT shunts as discussed above is shown in FIG. 9B illustrates a partially transparent transformer-rated plunger switch assembly 700 in accordance with some embodiments of the invention. In some embodiments, the secondary housing 800 comprising a generally cylindrical wall 810 capped by a first end 815 and a second end 820 is positioned in the transformer-rated meter socket 350 with the first end 815 supporting the adaptor socket 359, and the second end 820 adjacent the platform 375 and secured using coupler 825. During operation, in an open operation condition, the current can flow to the meter 100 when it is in normal operation. In a closed operation, current can flow safely to ground to prevent electric shock to maintenance personnel.

In some embodiments, one or more components, modules or assemblies of a smart pole meter system can be configured as a stand-alone unit capable of integrating externally or internally with various devices and applications. In some embodiments of the invention, one or more components, modules or assemblies of a smart pole meter system can be integrated with various other systems to provide additional and augmented functions. For example, FIG. 10A illustrates a perspective view of a pole 1000 (e.g., such as a light pole) including an integrated transformer-rated pole meter system (foot print metering solution 300 including a transformer-rated meter socket assembly 305 with coupled meter 100 within the light dome 1002). Further, FIG. 10B illustrates an image 1050 showing pole meter systems including pole 1000 (e.g., such as a light pole) showing options for an integrated meter system of FIG. 10A (inset view 1070) or coupled transformer-rated pole meter system (inset view 1060). In some embodiments, power delivery or access can be coupled to the pole base 1090 and metered by the pole 1000 using foot print metering solution 300.

Figure 10C:
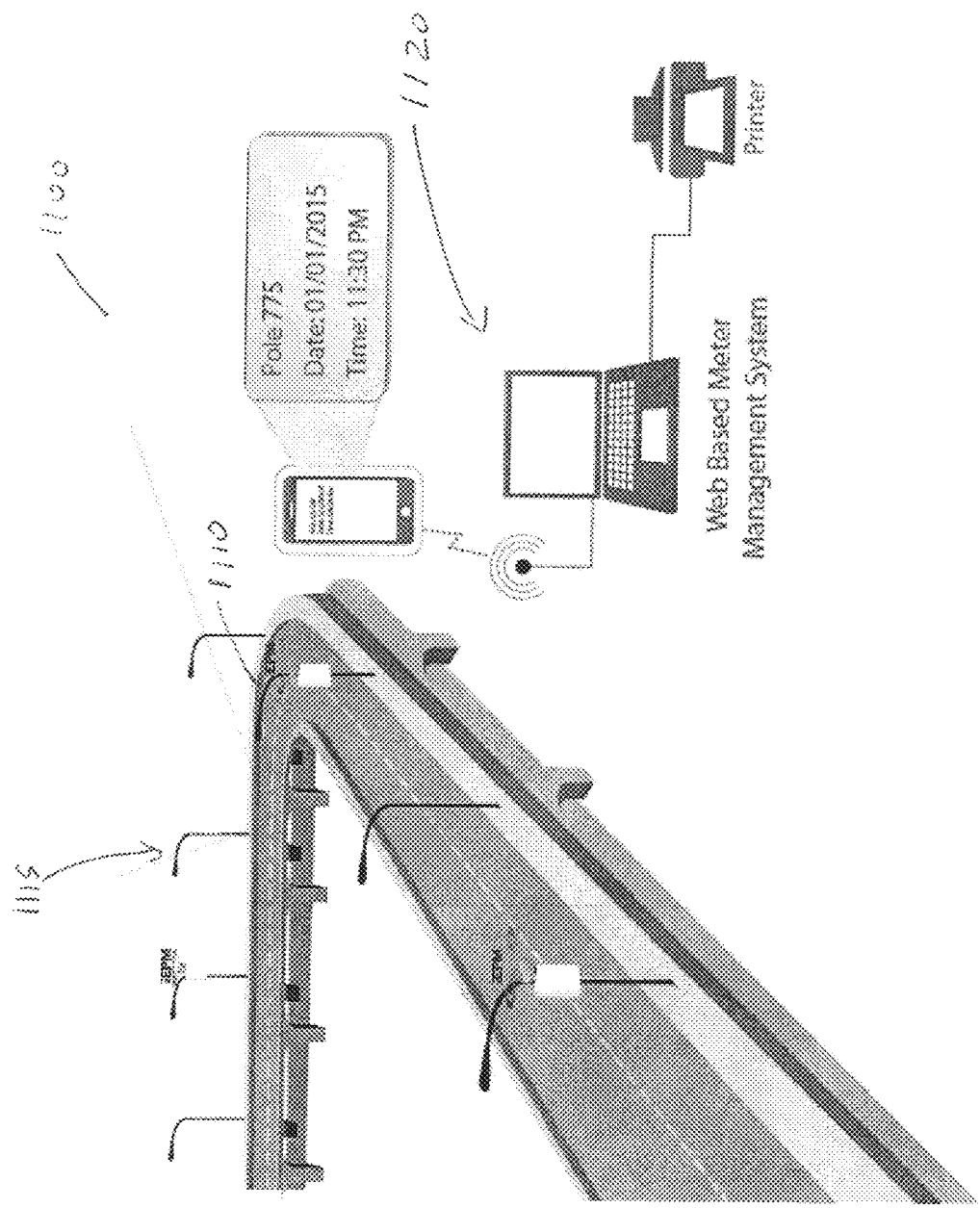
FIG. 10C illustrates pole meter power system in accordance with some embodiments of the invention.

In some embodiments, transformer-rated pole meter systems as shown in FIGS. 10A and 10B can be utilized in other forms of infrastructure and can be integrated with an energy delivery network. For example, FIG. 10C illustrates pole meter power system 1100 including one or more poles 1110 configured for delivery and metering of power. In some embodiments, one or more web-enabled applications and/or a cloud service system 1120 can enable customer access to various metering services of a lighting infrastructure 1115. In some embodiments, data can be accessed through a web application in a desktop computer or any mobile computer and/or telecommunication device such as a smartphone.

Figure 11:
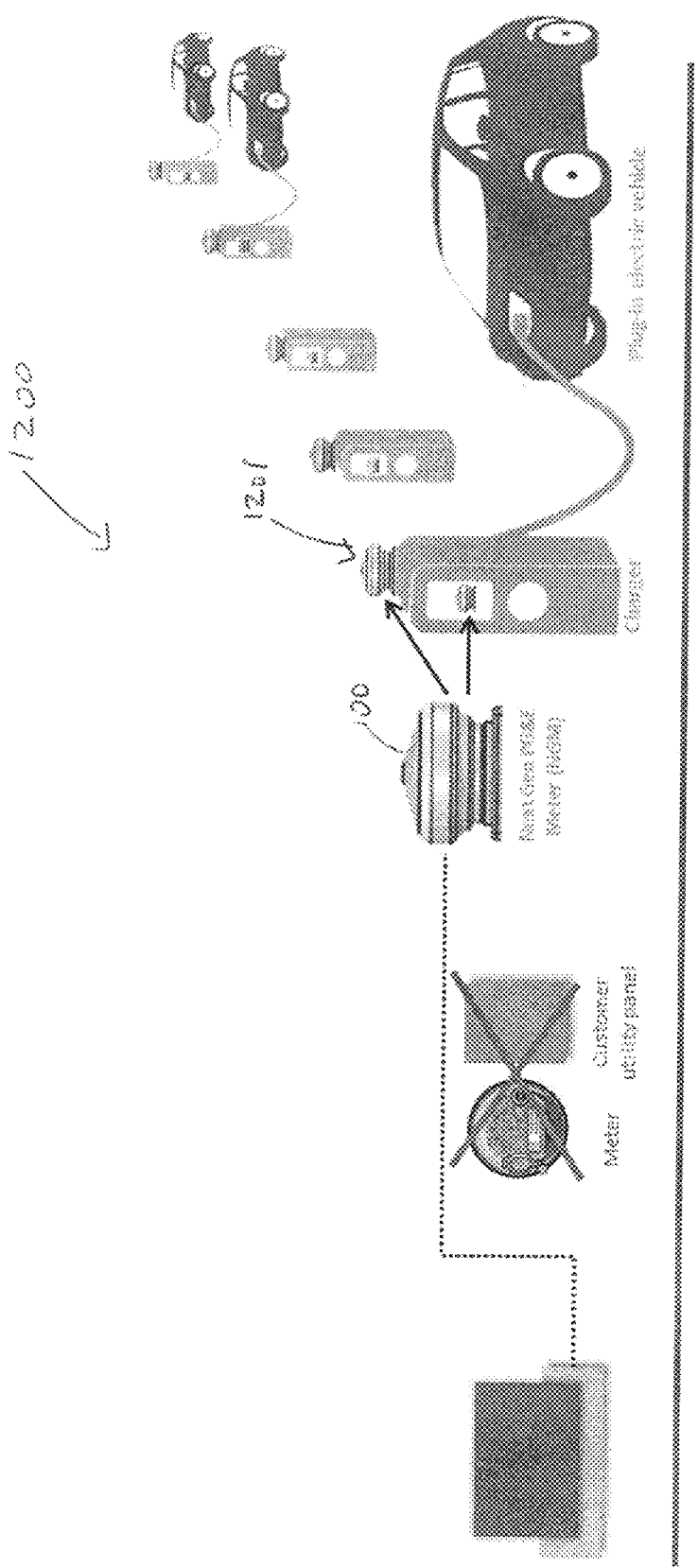
FIG. 11 illustrates a system overview of infrastructure integration of smart pole meter with an EV charging station in accordance with some embodiments of the invention.

Further, FIG. 11 illustrates a system overview 1200 of infrastructure integration of smart pole meter with an EV charging stations 1201 in accordance with some embodiments of the invention. In some embodiments, the system can function as a fixed, semi-permanent, or portable energy meter, enabling customers and utilities to monitor and track energy usage and operations of customer appliance/devices/vehicles and utility infrastructure operations (electric, gas, water, data, information, etc.) real-time and by location. Some embodiments of the invention include a smart pole meter system functioning within an operational energy metering system and method in accordance implemented with smart poles (e.g., such as pole 1000). In some embodiments, more modules of the smart pole meter system can be installed with an infrastructure (e.g., such as a power delivery infrastructure using one or more poles 1000) and can couple to a utility data management system (e.g., by coupling to at least one computing network) as described earlier with respect to FIGS. 10B and 10C.

In some embodiments, through one or more web-enabled applications and/or a cloud service system, customer access to various metering services can be provided, including, but not limited to billing, energy (and/or gas, water, data, information, etc.) usage and statistics, current energy (and/or gas, water, data, information, etc.) use and system/device status. Once integrated or coupled to a client's infrastructure, energy use (kWh and kVARh) and operational function such as real time (or substantially real time) voltages and current, and grid awareness such as the physical location of the meter can be processed through the cloud resource linked with a utility data management system. Some embodiments can include provisions for phase voltage, current and phase angle in real (or substantially real) time. In some embodiments, computation of kWh consumption and other power metrics can be processed by cloud computing with various communication back-haul options. In some embodiments, the customer can deploy at least one smart pole energy meter at, for example, a fixed location (such as a residential or commercial building or business), and monitor any of the aforementioned parameters at the location or at a remote location using a mobile device. For example, in some embodiments, the customer can use a mobile laptop computer and/or mobile phone or smart phone to monitor at least one parameter of the energy meter. Personal digital assistants, pagers, digital tablets, or other processor-based devices can be used to access the cloud resource either through a wireless (e.g., a cellular or WiFi signal) or through a wired link coupled to the cloud resource.

In another example embodiment, a customer can deploy at least smart pole meter system with a temporary or seasonal residential or commercial building or business, or with a remote charging station for an electric vehicle, and monitor any of the aforementioned parameters at the location or at a remote location. In the latter example embodiments, smart pole meter system can be used to guide customers when and where to plug in either to charge or discharge, and potentially lower operating/maintenance cost of an EV. This can enable customers and utilities to better manage EV loads (when charging) and generations (when discharging), and help lower costs of the grid construction, maintenance and operation. Thus, EVs with embodiments of the smart pole meter systems described herein can support and benefit the electrical grid system, and customers can be provided with real time charging/discharging cost and kWh quantity. Furthermore, because the cloud-based system can be managed by and/or coupled to at least one utility data management system, the system can be used to guide customers when and where to plug in either to charge or discharge based on location, charging station status, local and area-wide grid loads, etc., providing real time location based charge/discharge updates, operating with real time data on the grid. Some embodiments can include a two-way inverter safety switch for inverter application for charge/discharge.

In some other embodiments, the smart pole metering system can include a gas metering system, multi-color streetlight, electric vehicle induction charging, data and information metering systems, streetlight metering and/or telecom data metering, and vehicle telemetry. Thus the electrical outages, gas/water leakage, and usage information/data can be monitored and detected in real or near real time. Further, in some embodiments, the smart pole meter system can function as a telecommunication conduit for other services such as internet, video, TV, advertisements, etc. Moreover, in some embodiments, using customer identification information, the smart pole meter system can function as a telecommunication conduit for services (i.e. internet, video, TV, advertisements, etc.) that are tailored or targeted to the customer's needs, preferences, or geographic location. In some embodiments, the system can generate licensing fees for revenues that can help lower the customer's energy rate. Further, in some embodiments, the system can enable customers to be informed about commercial services, public safety (i.e. shopping, police, fire, hospital, etc.), and can be used to improve public and personal safety (i.e. an emergency situation, such as accidents, stranded vehicle, etc.). Some embodiments can also include electrical outage and gas/water leakage monitoring and/or call notifications and identifications. Further, some embodiments can function as or couple to telecom hubs that can provide improved bandwidth for field personnel communications and provide mobile telemetry. In some embodiments, the system can provide local, area-wide, and/or global Internet services. Further, in some embodiments, the smart pole meter system can function to provide vehicle telemetry and/or form part of a self-driving infrastructure. In some embodiments, using a combination of smart poles and/or micro cell sites, the smart pole meter system relay vehicle telemetry information, and provide remote monitoring of charge/discharge within an electric vehicle route.

Some embodiments of the invention include at least one RFID module that provides tracking and asset management capability. For example, in some embodiments, the meter socket 350 and/or meter 100 can include at least one RFID module. In some embodiments, the RFID module can comprise a variety of modules types, including common RF protocols and standards. For example, in some embodiments, the RFID module can include class 1 including a simple, passive, read-only backscatter tag with one-time, field-programmable non-volatile memory. Other embodiments can utilize class 2, a passive backscatter tag with up to 65 KB of read-write memory. Other embodiments can use a class 3: a semi-passive backscatter tag, with up to 65 KB read-write memory; essentially, and with a built-in battery. Some further embodiments include a class 4: an active tag with built-in battery, an internal transmitter for transmitting to the reader. Some further embodiments can implement a class 5: an active RFID tag that can communicate with other class 5 tags and/or other devices. Some embodiments include RFID standards for automatic identification and item management (ISO 18000 series standards). Some embodiments of the invention include an 18000-1 standard that uses generic parameters for air interfaces for globally accepted frequencies. Some embodiments can use an 18000-2 standard with an air interface for 135 KHz. Some further embodiments can use a 18000-3 standard with an air interface for 13.56 MHz. In some further embodiments of the invention, standard 18000-4 can use an air interface for 2.45 GHz. In other embodiments of the invention, standard 18000-5 with an air interface for 5.8 GHz can be used. In some other embodiments, 18000-6 with an air interface for 860 MHz to 930 MHz can be used. In some alternative embodiments, standard 18000-7 with an air interface at 433.92 MHz can be used. Some further embodiments include RF components operating at a 2.4 GHz-ISM frequency band. Some embodiments include an RF system and method of operation compatible with Bluetooth® and IEEE 802.11x within a mobile device. Bluetooth is a registered trademark owned by Bluetooth® SIG.

In some further embodiments, the meter socket 350 and/or meter 100 can be equipped with various radio frequency communication technologies that can switch between, receive and provide, including but not limited to, Cellular 4G/LTE, WiFi, WiMAX, WiSun, 400 MHz RF, 900 MHz RF, etc. In some embodiments of the invention, the meter socket can be replaceable, interchangeable and/or upgradeable depending on the energy needs and requirements of the customer or the utility company. For example, some embodiments of the invention also include an RF module that can provide sub-metering and communication interconnections between sub-meters and main meters, and interconnectivities with other sub-meters. Moreover, in some embodiments of the invention, the system can provide services such as Internet, home phone, TV, and video. In some embodiments, the RF module can be coupled to a fixed energy meter. For example, in some embodiments, the RF module can be mounted or otherwise coupled to a fixed energy meter. In some other embodiments, the RF module can be mobile and not mounted or otherwise physically coupled to an energy meter. In some embodiments, the RF module can be removably mounted or coupled to an energy meter. In some embodiments, when the RF module is mounted or coupled to the energy meter, information can be transferred between the energy meter and the RF module. In some embodiments, a user can move the RF module to within a specific distance from the energy meter to enable transfer of information between the RF module and the energy meter. The specific distance includes distances that are known in the art for RF data transmission distances for known RF standards.

In some embodiments, the energy and data/information metering system can include an energy and data/information meter including at least one sensor and power supply. The system can include a socket based—ANSI (CL 200, CL20), a disconnect switch, and a communication Module with display and switchable multi-communication technologies (4G/LTE, WiFi, WiMAX, WiSun, 400 MHz & 900 MHz RF, etc.) Standard male/female pins can be used to make connection to the meter, and can comprise neutral, phase a+b+c voltage ac signals, phase a+b+c current ac signals, as well as +/−dc power supply connections to electric, gas, water, data/information meters/metering systems. The system can be modular and enable mobility, and be configured for multi-network and cloud computing (described earlier). Further, the energy meter can include an internal-meter temperature monitoring system. When coupled to the cloud system, billing information can be processed and billing data transferred to the utility MDM. The system can be utilized across a wide variety of application including fixed premises, circuit breakers, appliances, EVs, PVs, electric charging stations, battery storage, Microcell Tower/Pole, etc., capable of monitoring phase voltage, current and angle real time. In some embodiments, the system can provide hotspot services (Internet, home/car/cell phone, TV, Video, etc.) In some embodiments, the voltage and current sensors of the invention can include potential and current transformers and/or Hall Effect technology. In some embodiments, the system can implement a 200 Amp disconnect switch for residential systems, and an AC/DC power supply for utility block. Standard male/female pins can be used to make connection to the block: Neutral, Phase A+B+C voltage AC signals, Phase A+B+C current AC signals, AC or +/−DC Power Supply.

In some embodiments of the invention, any of the meters or assemblies described herein can be mounted or coupled to multiple applications such as buildings, homes, appliances, circuit breakers, PVs, battery storages, EVs, charging stations, microcell tower/pole, etc. Applications can include parking lot lighting, mobile home power, residential/commercial, electric vehicle charging station at streetlight poles, photovoltaic (PV), PV inverter, distribution capacitor monitoring.

In some embodiments, any of the meters or assemblies described here can perform, provide, store, and poll/communicate/transfer routinely, on demand, and ad-hoc the telecommunication bits/bytes metrology in utility cloud computing and/or in the meter. In some embodiments of the invention, power quality information voltage, current and phase angle values at a user-specified interval, and/or sampling technique on phase voltage and current wave forms can be used by the system to provide a variety of energy metrics. For example, in some embodiments, the system can calculate the energy usage, and/or interval temperature, electric energy kWh and kVARh values in a user-specified period, and/or electric service analyses and information to detect wrong meter socket installations, and/or electric service analyses and information to detect tampering and provide potential tampering leads. In some embodiments, the system can include communication that can switch between technologies or not switch (are fixed). Some embodiments include communication that can utilize and/or provide any one of telecommunication technologies as designated or programmed. In some embodiments, communications can be bidirectional between the meter and the cloud platform, and live monitoring/display can occur in the office. In some embodiments, communications frequency is user-specified in milliseconds, shorter, or longer, on demand, ad-hoc, etc.

In some embodiments, any of the meters or assemblies described herein can assemble data for a graphical presentation of electric phase voltage and current waveforms, and provide access to display of voltage, current and phase angle values real time. Further, some embodiments can provide and store voltage, current and phase angle values at a user-specified interval, and transfer the interval data to other utility applications coupled to the network (e.g., the cloud network). Some embodiments provide a user with the capability to provide and store power quality information voltage, current and phase angle values at a user-specified interval. Moreover, in some embodiments, the system can perform sampling techniques on phase voltage and current wave forms to calculate the energy usage.

In some embodiments, any of the meters or assemblies described herein, the RF module, the RFID module and/or the meter component of the system can include one or more security protocols. For example, some embodiments include advanced encryption standard (AES). Some embodiments can include performance of cryptographic challenge and response protocols, including dynamic challenge-response protocols.

In some embodiments of the invention, any of the meters or assemblies described herein can incorporate various semiconductor technologies that enable mobility metering and broadband metering within an integrated device with reduced size compared with conventional metering systems. For example, some embodiments utilize various system-on-chip technologies that can integrate a variety functions that would normally reside in separate modules and/or coupled devices. In some embodiments, the system-on-chip systems can incorporate an operating system, and a host interface along with data collection and error control processing. Further, the system-on-chip can integrate mobility and communications modules, with seamless integration with the operating system, data collection, and host interface.

Figure 12:
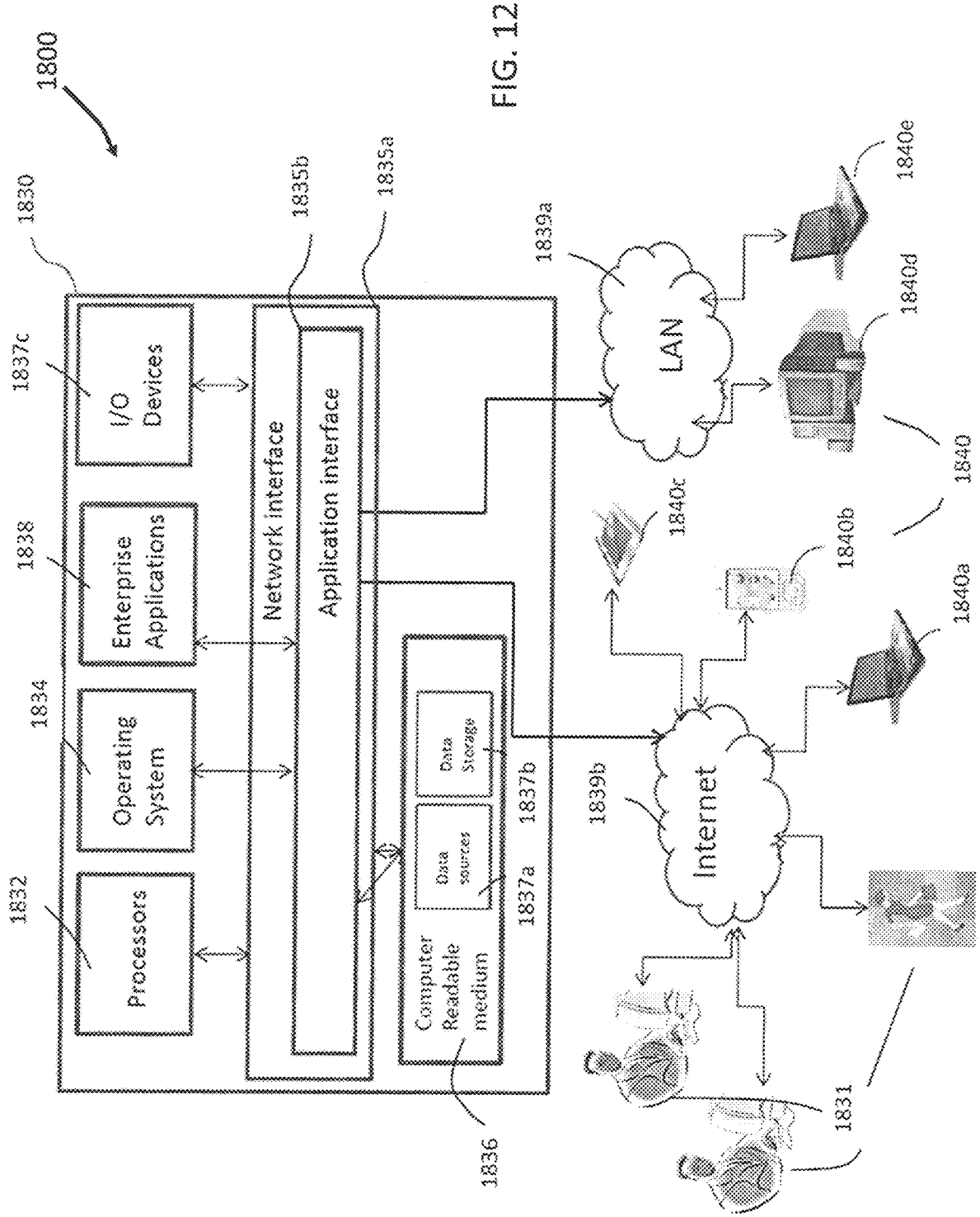
FIG. 12 illustrates a system for operating a charging infrastructure using smart pole meters in accordance with some embodiments of the invention.

In some embodiments of the invention, any of the meters or assemblies described herein can use at least one computing system within a networked metering or power network. For example, FIG. 12 shows an architecture diagram 1800 of a system for operating a smart meter system according to one embodiment of the invention. The diagram 1800 shows one example of a system 1830 for performing one or more of the methods of the smart meter system that, as one non-limited example, can operate, read, send data and/or read data from the meter 100. As shown, the system 1830 can include at least one computing device, including one or more processors. Some processors can include processors 1832 residing in one or more conventional server platforms. In some embodiments, the system 1830 can include a network interface 1835a and/or an application interface 1835b coupled to at least one processor 1832 capable of running at least one operating system 1834, and one or more of the software modules 1838 (e.g., such as enterprise applications). In some embodiments, the software modules 1838 can include server-based software platform that can include smart meter system and method 100 software modules suitable for hosting at least one user account and at least one client account, as well as transferring data between one or more accounts.

Some embodiments of the invention relate to or include a device or an apparatus for performing these operations of the operating system 1834 and/or the software modules 1838. The apparatus can be specially constructed for the required purpose, such as a special purpose computer. When defined as a special purpose computer, the computer can also perform other processing, program execution or routines that are not part of the special purpose, while still being capable of operating for the special purpose. Alternatively, the operations can be processed by a general purpose computer selectively activated or configured by one or more computer programs stored in the computer memory, cache, or obtained over a network. When data are obtained over a network the data can be processed by other computers on the network, e.g. a cloud of computing resources.

With the above embodiments in mind, it should be understood that the invention can employ various computer-implemented operations involving smart meter system and method 100 data stored in computer systems. Moreover, the above-described databases and models throughout the smart meter system and method 100 can store analytical models and other data on computer-readable storage media within the system 1830 and on computer-readable storage media coupled to the system 1830. In addition, the above-described applications of the smart meter system and method 100 system can be stored on computer-readable storage media within the system 1830 and on computer-readable storage media coupled to the system 1830. These operations are those requiring physical manipulation of physical quantities. Usually, though not necessarily, these quantities take the form of electrical, electromagnetic, or magnetic signals, optical or magneto-optical form capable of being stored, transferred, combined, compared and otherwise manipulated.

Some embodiments include the system 1830 comprising at least one computer readable medium 1836 coupled to at least one data storage device 1837*b*, and/or at least one data source 1837*a*, and/or at least one input/output device 1837*c*. In some embodiments, the invention embodied by the smart meter system and method 100 can be embodied as computer readable code on a computer readable medium 1836. The computer readable medium 1836 can be any data storage device that can store data, which can thereafter be read by a computer system (such as the system 1830). Examples of the computer readable medium 1836 can include hard drives, network attached storage (NAS), read-only memory, random-access memory, FLASH based memory, CD-ROMs, CD-Rs, CD-RWs, DVDs, magnetic tapes, other optical and non-optical data storage devices, or any other physical or material medium which can be used to tangibly store the desired information or data or instructions and which can be accessed by a computer or processor (including processors 1832).

In some embodiments of the invention, the computer readable medium 1836 can also be distributed over a conventional computer network via the network interface 1835*a* so that the smart meter system and method 100 embodied by the computer readable code can be stored and executed in a distributed fashion. For example, in some embodiments, one or more components of the system 1830 can be tethered to send and/or receive data through a local area network ("LAN") 1839*a*. In some further embodiments, one or more components of the system 1830 can be tethered to send or receive data through an internet 1839*b* (e.g., a wireless internet). In some embodiments, at least one software application 1838 running on one or more processors 1832 can be configured to be coupled for communication over a network 1839*a*, 1839*b*. In some embodiments, one or more components of the network 1839*a*, 1839*b* can include one or more resources for data storage, including any other form of computer readable media beyond the media 1836 for storing information and including any form of computer readable media for communicating information from one electronic device to another electronic device.

In some embodiments, the network 1839*a*, 1839*b* can include wide area networks ("WAN"), direct connections (e.g., through a universal serial bus port) or other forms of computer-readable media 1836, or any combination thereof. Further, in some embodiments, one or more components of the network 1839*a*, 1839*b* can include a number of client devices which can be personal computers 1840 including for example desktop computers 1840*d*, laptop computers 1840*a*, 1840*e*, digital assistants and/or personal digital assistants (shown as 1840*c*), cellular phones or mobile phones or smart phones (shown as 1840*b*), pagers, digital tablets, internet appliances, and other processor-based devices. In general, a client device can be any type of external or internal devices such as a mouse, a CD-ROM, DVD, a keyboard, a display, or other input or output devices 1837*c*. In some embodiments, various other forms of computer-readable media 1836 can transmit or carry instructions to a computer 1840, including a router, private or public network, or other transmission device or channel, both wired and wireless. The software modules 1838 can be configured to send and receive data from a database (e.g., from a computer readable medium 1836 including data sources 1837*a* and data storage 1837*b* that can comprise a database), and data can be received by the software modules 1838 from at least one other source. In some embodiments, at least one of the software modules 1838 can be configured within the system to output data to a user 1831 via at least one smart meter (e.g., to a computer 1840 comprising a smart meter).

In some embodiments, the system 1830 as described above can enable one or more users 1831 to receive, analyze, input, modify, create and send data to and from the system 1830, including to and from one or more enterprise applications 1838 running on the system 1830. Some embodiments include at least one user 1831 coupled to a computer 1840 accessing one or more modules of the smart meter system and method 100 including at least one enterprise applications 1838 via a stationary I/O device 1837*c* through a LAN 1839*a*. In some other embodiments, the system 1830 can enable at least one user 1831 (through computer 1840) accessing enterprise applications 1838 via a stationary or mobile I/O device 1837*c* through an internet 1839*a*.

The embodiments of the present invention can also be defined as a machine that transforms data from one state to another state. The data can represent an article, that can be represented as an electronic signal and electronically manipulate data. The transformed data can, in some cases, be visually depicted on a display, representing the physical object that results from the transformation of data. The transformed data can be saved to storage generally or in particular formats that enable the construction or depiction of a physical and tangible object. In some embodiments, the manipulation can be performed by a processor. In such an example, the processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine. Computer-readable storage media, as used herein, refers to physical or tangible storage (as opposed to signals) and includes without limitation volatile and non-volatile, removable and non-removable storage media implemented in any method or technology for the tangible storage of information such as computer-readable instructions, data structures, program modules or other data.

Although method operations can be described in a specific order, it should be understood that other housekeeping operations can be performed in between operations, or operations can be adjusted so that they occur at slightly different times, or can be distributed in a system which allows the occurrence of the processing operations at various intervals associated with the processing, as long as the processing of the overlay operations are performed in the desired way.

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the description herein.

The invention claimed is:

1. An assembly comprising:
a support platform;
at least one transformer coupled to the support platform;
a socket housing configured to be coupled to an electric meter, the socket housing coupled to the support platform, wherein the socket housing comprises:
a socket interface extending from a top side of the socket housing, the socket interface including electrical prong inlets configured to couple to electrical prongs of the electric meter;
a secondary housing at least partially enclosed within the socket housing, the secondary housing including at least one CT shunt; and
at least one switch assembly including an actuator including at least one actuator shaft extending through the top side of the socket housing adjacent the electrical prong inlets, wherein the at least one actuator shaft is configured and arranged to actuate the at least one switch assembly when a meter is seated into a connector of the socket interface, and whereby such actuation shunts secondary current from the CT to ground.

2. The assembly of claim 1, further comprising a removable or portable meter coupled to the socket interface.

3. The assembly of claim 1, wherein the at least one actuator shaft is configured and arranged to be coupled to at least one shunt via at least one roller contact.

4. The assembly of claim 1, wherein the at least one actuator shaft is supported within a spring in a plunger housing, the spring positioned in a cavity of the plunger housing and extending coupled to a contact of the at least one actuator shaft.

5. The assembly of claim 3, wherein the at least one shunt includes a plurality of electrical contacts.

6. The assembly of claim 5, wherein the at least one actuator shaft is configured and arranged to electrically couple and decouple from the plurality of electrical contacts based on the movement of the at least one actuator shaft.

7. An electric meter assembly comprising:
a socket housing including a socket interface extending from a top side of the socket housing, the socket interface including electrical prong inlets;
a removable or portable meter coupled to the socket interface, wherein electrical prongs of the removable or portable meter are coupled into the electrical prong inlets;
at least one actuator including at least one moveable actuator shaft extending through the top side adjacent the electrical prong inlets, wherein the at least one moveable actuator shaft is positioned pushed into at least one switch assembly by the removable or portable meter; and
at least one strap coupled at one end to at least one side of the socket housing and removably extending over at least a portion of the meter from one side of the socket to an opposite side of the socket.

8. The assembly of claim 7, wherein the at least one strap is pre-bent.

9. The assembly of claim 7, wherein the socket housing includes at least one strap latch configured to couple to a second end of the at least one strap.

10. The assembly of claim 7, further comprising a tamper-resistant seal coupled to a side of the socket housing.

11. The assembly of claim 10, wherein the tamper-resistant seal is configured and arranged to be threaded through an aperture in the at least one strap.

12. The assembly of claim 7, wherein the at least one strap comprises metal or metal alloy.

13. The assembly of claim 7, wherein the at least one strap comprises polymer.

14. The assembly of claim 7, further comprising at least one bracket coupled to at least one side of the socket housing.

15. The assembly of claim 7, further comprising at least one power receptacle extending through one side of the socket housing.

16. The assembly of claim 7, wherein the socket housing is coupled to a support platform including a coupled transformer.

17. The assembly of claim 7, wherein the removable or portable meter comprises a vehicle charger, wherein the assembly comprises or forms part of an electric vehicle charging station.

18. The assembly of claim 7, wherein the removable or portable meter comprises a radio or RF transmitter configured for remote monitoring enabling an RF network to send captured meter data back to a central monitoring system.

19. The assembly of claim 7, wherein the removable or portable meter comprises a smart pole meter configured to measure power consumption of equipment attached to, or contained within a streetlight pole.

* * * * *